United States Patent
Jourba et al.

(10) Patent No.: US 10,312,247 B1
(45) Date of Patent: Jun. 4, 2019

(54) TWO TRANSISTOR FINFET-BASED SPLIT GATE NON-VOLATILE FLOATING GATE FLASH MEMORY AND METHOD OF FABRICATION

(71) Applicant: Silicon Storage Technology, Inc., San Jose, CA (US)

(72) Inventors: Serguei Jourba, Aix en Provence (FR); Catherine Decobert, Pourrieres (FR); Feng Zhou, Fremont, CA (US); Jinho Kim, Saratoga, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/933,124

(22) Filed: Mar. 22, 2018

(51) Int. Cl.
*H01L 27/11524* (2017.01)
*H01L 29/423* (2006.01)
*H01L 29/78* (2006.01)
*H01L 29/66* (2006.01)
*H01L 29/788* (2006.01)
*H01L 21/28* (2006.01)

(52) U.S. Cl.
CPC .. *H01L 27/11524* (2013.01); *H01L 21/28273* (2013.01); *H01L 29/42328* (2013.01); *H01L 29/66825* (2013.01); *H01L 29/7838* (2013.01); *H01L 29/7851* (2013.01); *H01L 29/7883* (2013.01)

(58) Field of Classification Search
CPC ......... H01L 27/11524; H01L 29/66285; H01L 29/42328
See application file for complete search history.

(56) References Cited

U.S. PATENT DOCUMENTS

| | | |
|---|---|---|
| 5,029,130 A | 7/1991 | Yeh |
| 6,747,310 B2 | 6/2004 | Fan |
| 7,315,056 B2 | 1/2008 | Klinger |

(Continued)

OTHER PUBLICATIONS

U.S. Appl. No. 15/957,615, filed Apr. 19, 2018 entitled "Split Gate Non-volatile Memory Cells and Logic Devices With FINFET Structure, and Method of Making Same"—Applicant—Silicon Storage Technology, Inc.

(Continued)

*Primary Examiner* — William Coleman
(74) *Attorney, Agent, or Firm* — DLA Piper LLP (US)

(57) ABSTRACT

A non-volatile memory cell formed on a semiconductor substrate having an upper surface with an upwardly extending fin with opposing first and second side surfaces. First and second electrodes are in electrical contact with first and second portions of the fin. A channel region of the fin includes portions of the first and second side surfaces that extend between the first and second portions of the fin. A floating gate extends along the first side surface of a first portion of the channel region, where no portion of the floating gate extends along the second side surface. A word line gate extends along the first and second side surfaces of a second portion of the channel region. A control gate is disposed over the floating gate. An erase gate has a first portion disposed laterally adjacent to the floating gate and a second portion disposed vertically over the floating gate.

23 Claims, 28 Drawing Sheets

(56) References Cited

U.S. PATENT DOCUMENTS

| | | | |
|---|---|---|---|
| 7,329,580 B2* | 2/2008 | Choi | H01L 21/84 |
| | | | 257/E21.682 |
| 7,410,913 B2 | 8/2008 | Lee | |
| 7,423,310 B2 | 9/2008 | Verhoeven | |
| 7,868,375 B2 | 1/2011 | Liu | |
| 7,927,994 B1 | 4/2011 | Liu | |
| 8,068,370 B2* | 11/2011 | Lue | G11C 16/0408 |
| | | | 257/315 |
| 8,461,640 B2 | 6/2013 | Hu | |
| 9,276,005 B1 | 3/2016 | Zhou | |
| 9,276,006 B1 | 3/2016 | Chen | |
| 9,406,689 B2* | 8/2016 | Li | H01L 21/845 |
| 9,614,048 B2* | 4/2017 | Wu | H01L 29/42368 |
| 9,634,018 B2* | 4/2017 | Su | H01L 27/1052 |
| 10,032,891 B2* | 7/2018 | Baars | H01L 29/6681 |
| 2005/0012137 A1* | 1/2005 | Levi | H01L 27/115 |
| | | | 257/315 |
| 2006/0097310 A1* | 5/2006 | Kim | H01L 21/28282 |
| | | | 257/321 |
| 2008/0173921 A1* | 7/2008 | Li | B82Y 10/00 |
| | | | 257/311 |
| 2010/0320525 A1* | 12/2010 | Nagashima | H01L 27/11568 |
| | | | 257/324 |
| 2013/0270627 A1* | 10/2013 | Cheng | H01L 21/823431 |
| | | | 257/326 |
| 2017/0117285 A1* | 4/2017 | Chen | H01L 27/11521 |
| 2017/0125429 A1 | 5/2017 | Su et al. | |
| 2017/0271484 A1 | 9/2017 | Baars et al. | |
| 2017/0301683 A1* | 10/2017 | Chen | H01L 27/11546 |
| 2017/0345840 A1 | 11/2017 | Su et al. | |

OTHER PUBLICATIONS

U.S. Appl. No. 16/208,288, filed Dec. 3, 2018 entitled "FINFET-Based Split Gate Non-volatile Flash Memory With Extended Source Line FINFET, and Method of Fabrication"—Applicant—Silicon Storage Technology, Inc.

U.S. Appl. No. 16/028,244, filed Jul. 5, 2018 entitled "Split Gate Non-Volatile Memory Cells With Three-Dimensional FINFET Structure, and Method of Making Same"—Applicant—Silicon Storage Technology, Inc.

* cited by examiner

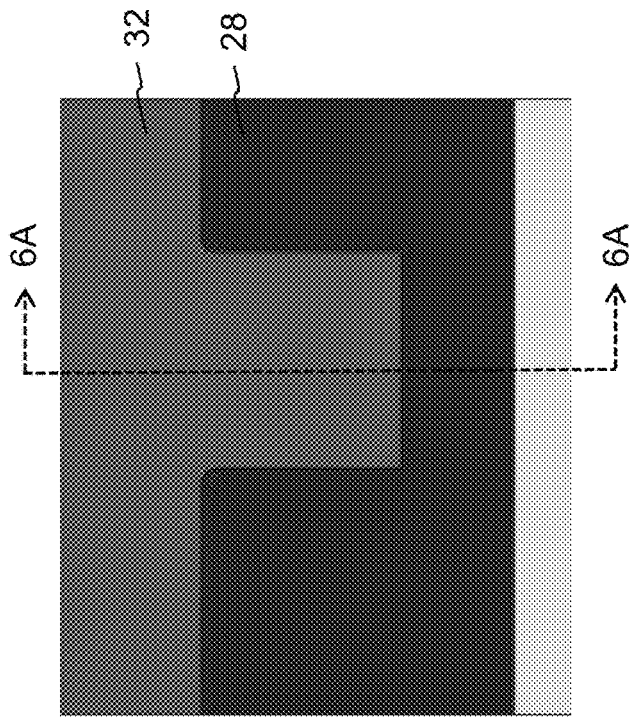
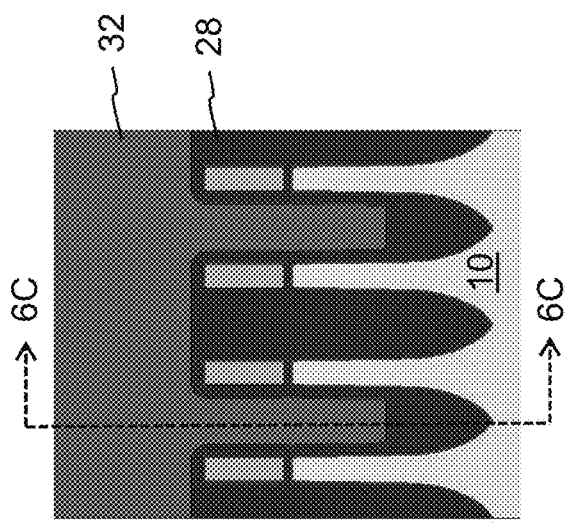
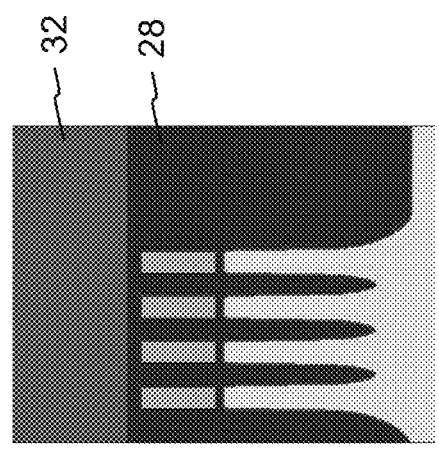
FIG. 6C
FIG. 6A
FIG. 6B

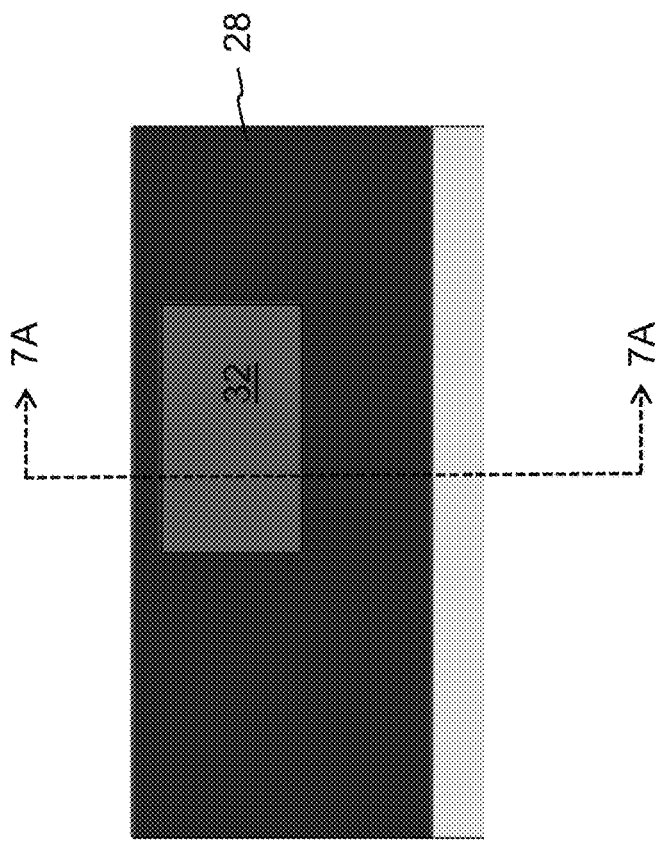
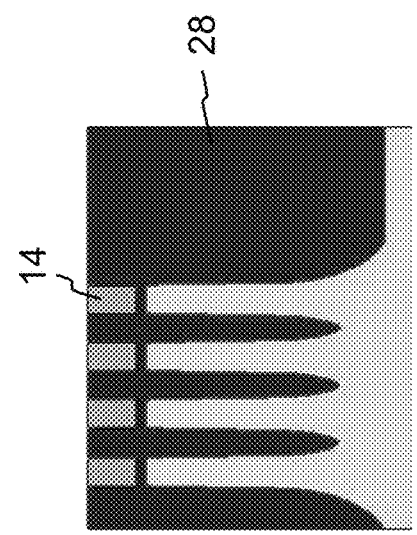
FIG. 7C
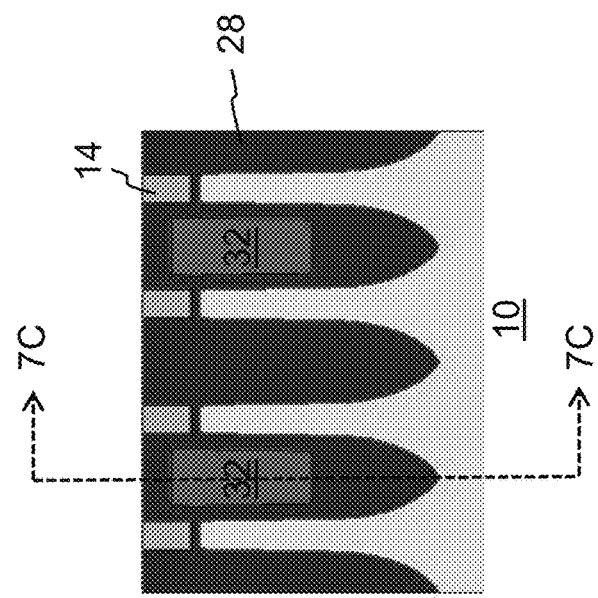
FIG. 7A
FIG. 7B

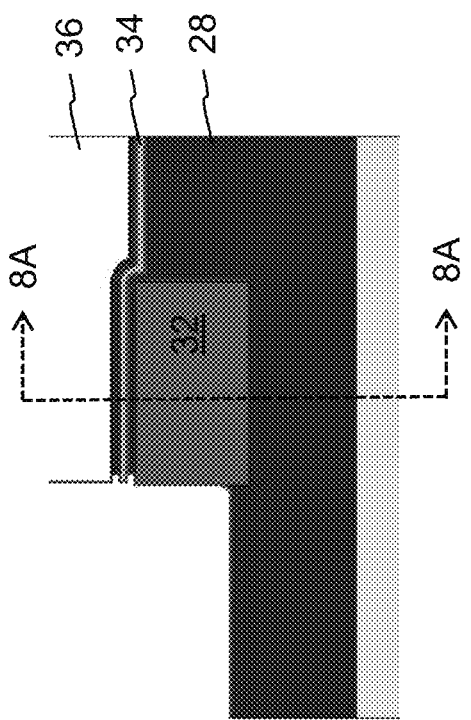
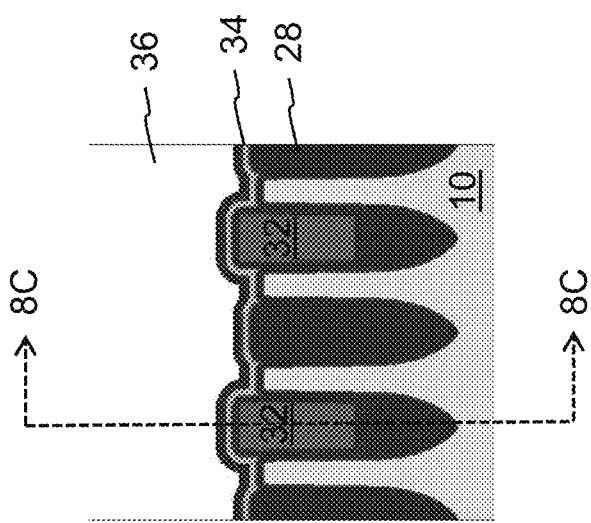
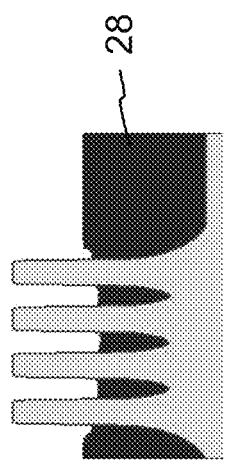
FIG. 8C
FIG. 8A
FIG. 8B

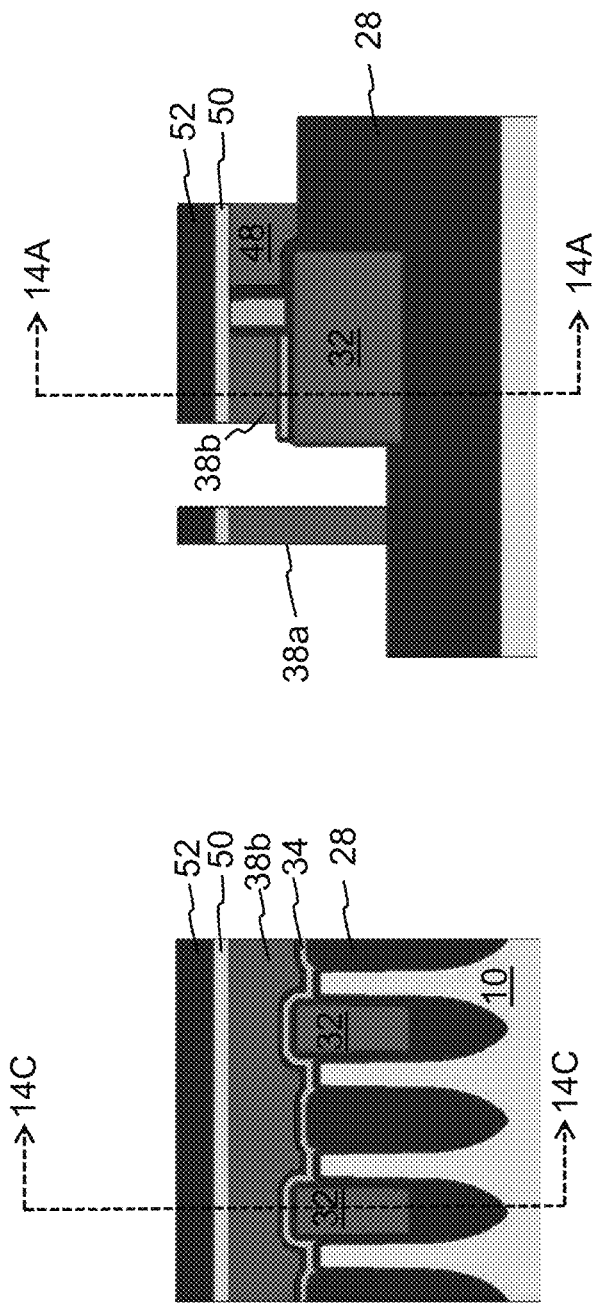
FIG. 14A
FIG. 14C
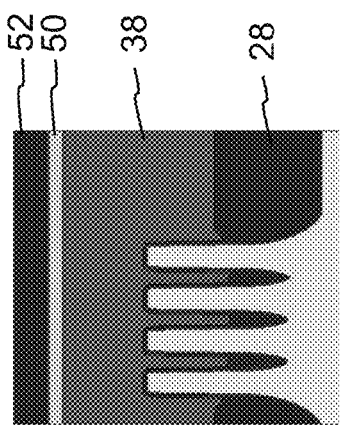
FIG. 14B

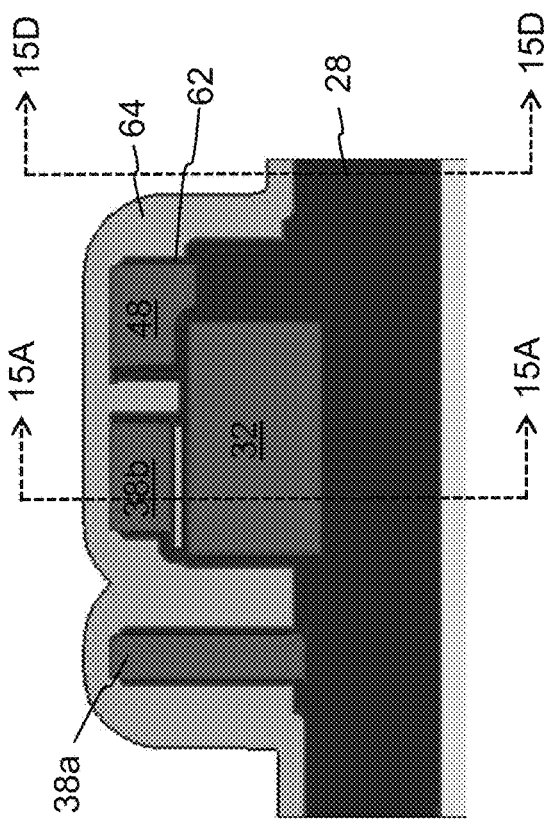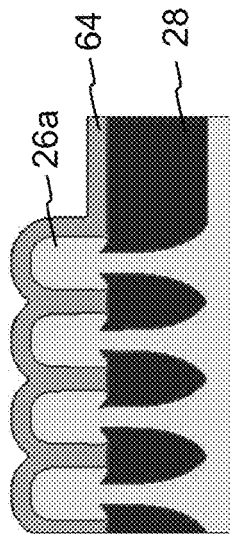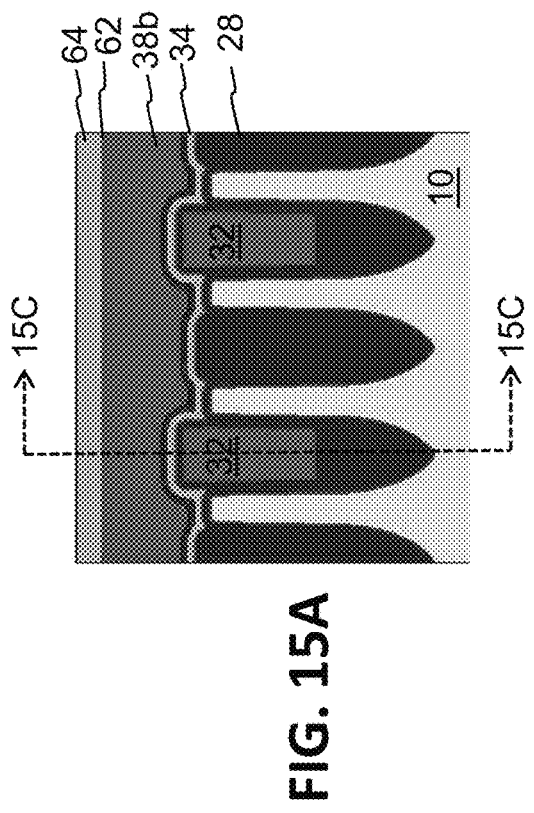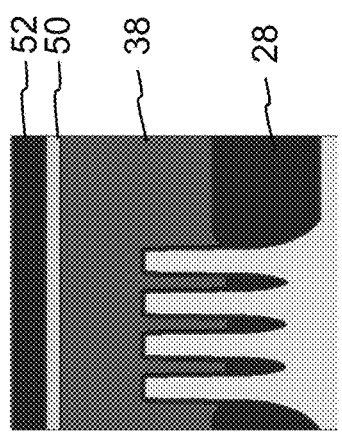
FIG. 15A
FIG. 15B
FIG. 15C
FIG. 15D

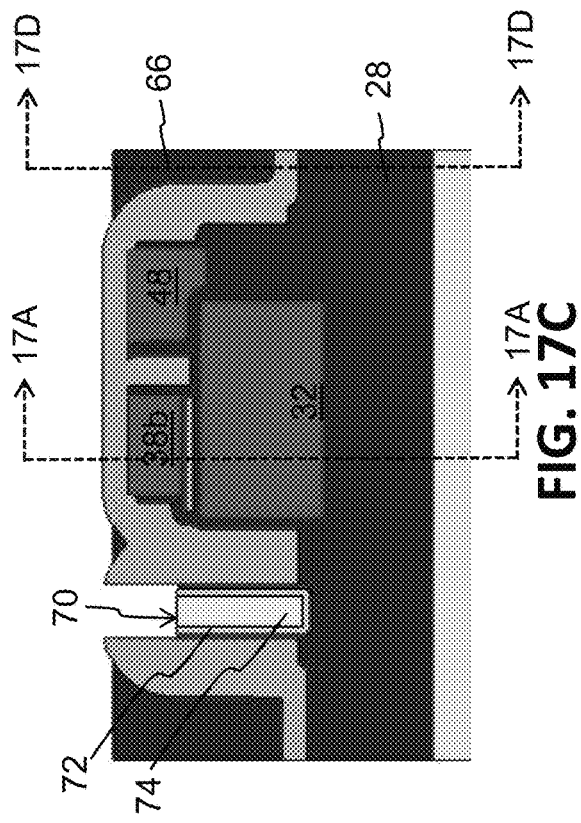
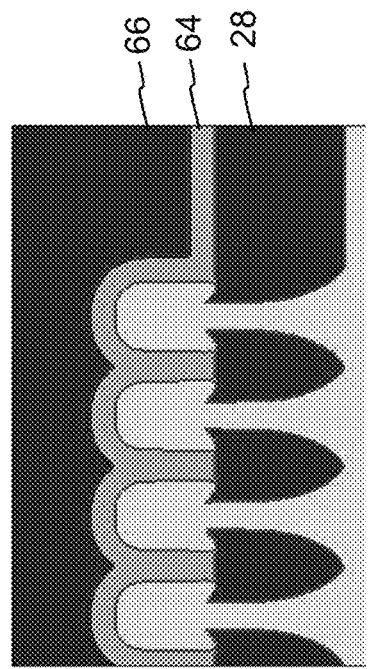
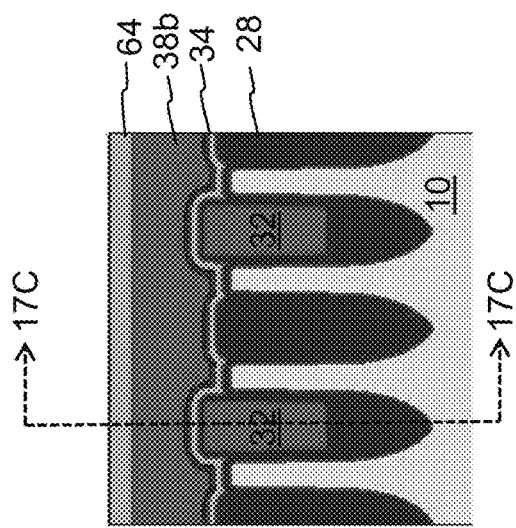
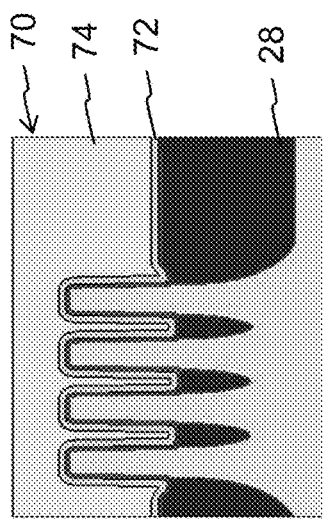
FIG. 17A
FIG. 17B
FIG. 17C
FIG. 17D

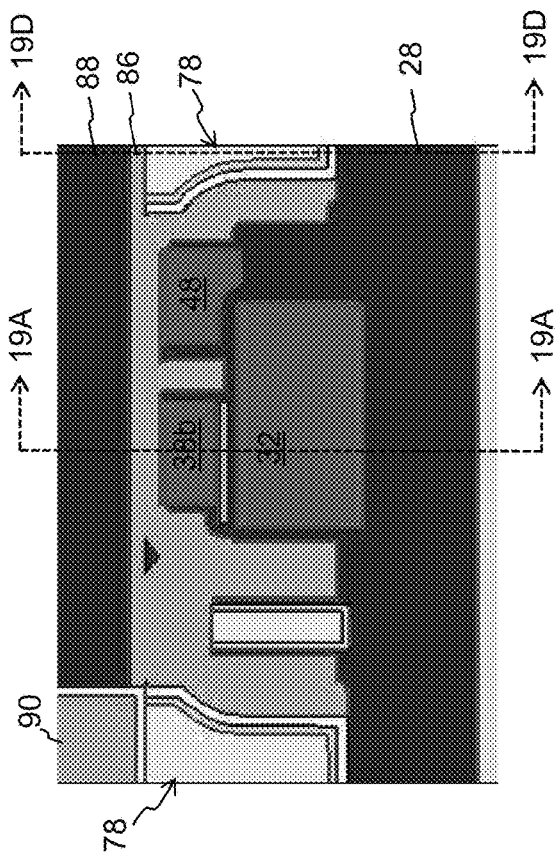
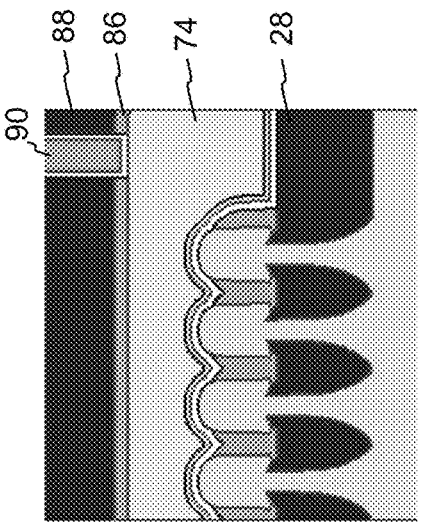
FIG. 19C
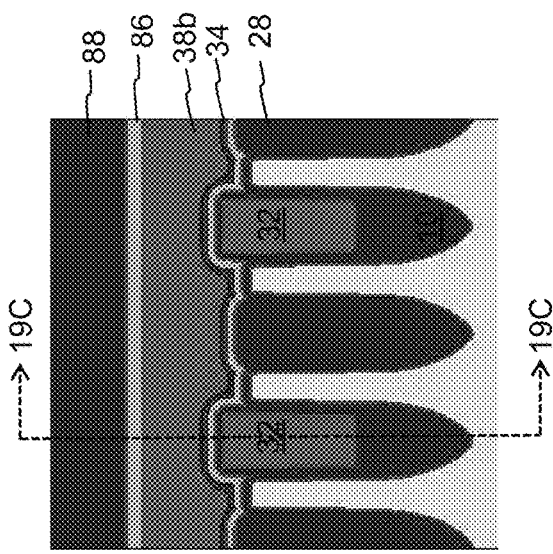
FIG. 19A
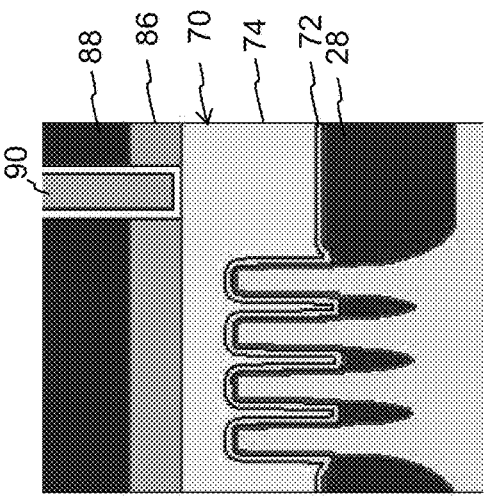
FIG. 19B
FIG. 19D

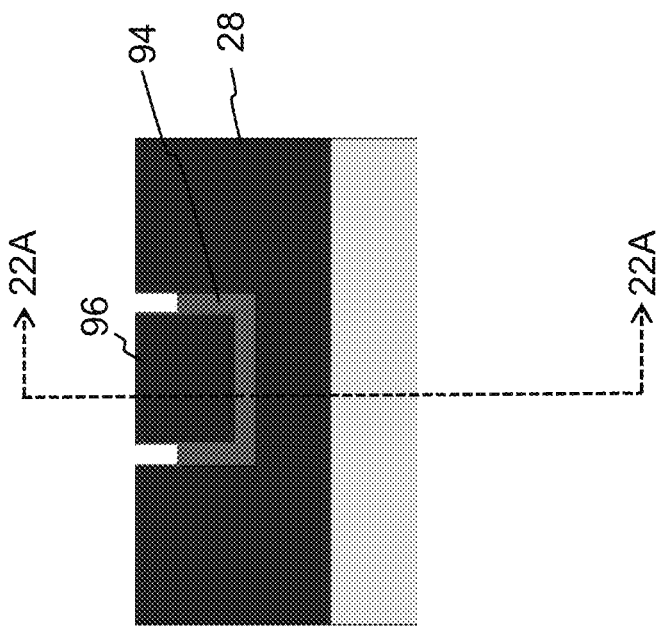
FIG. 22A
FIG. 22C
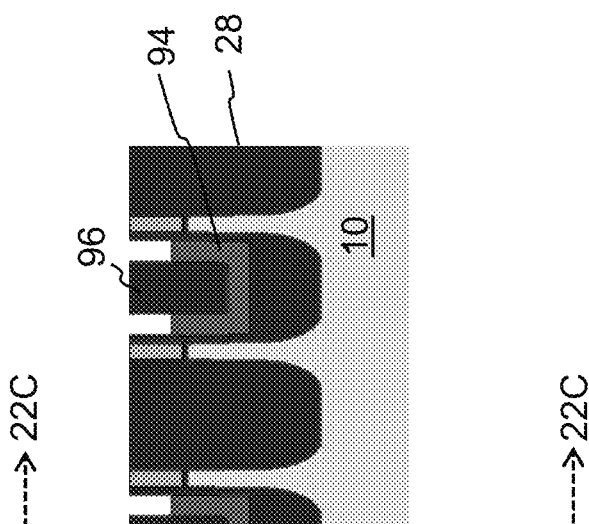
FIG. 22B

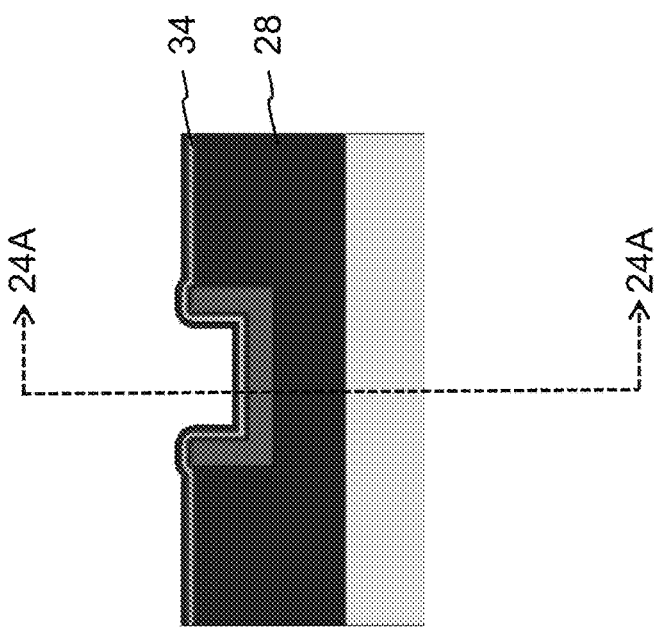
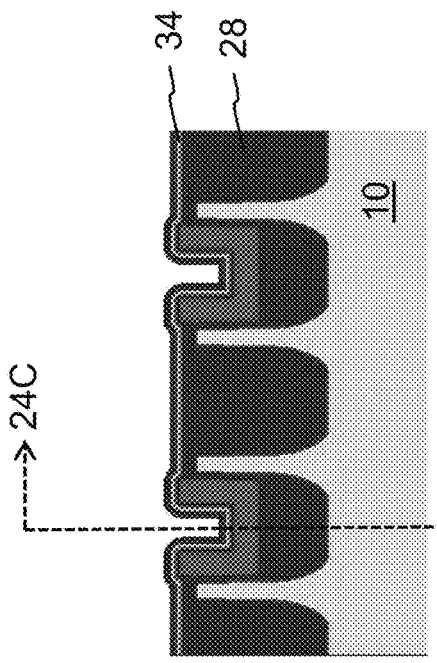
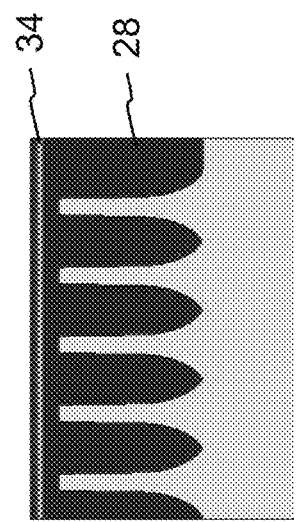
FIG. 24A
FIG. 24B
FIG. 24C

TWO TRANSISTOR FINFET-BASED SPLIT GATE NON-VOLATILE FLOATING GATE FLASH MEMORY AND METHOD OF FABRICATION

FIELD OF THE INVENTION

The present invention relates to non-volatile flash memory cell arrays.

BACKGROUND OF THE INVENTION

Non-volatile memory devices are well known in the art. For example, a split-gate memory cell is disclosed in U.S. Pat. No. 5,029,130 (which is incorporated herein by reference for all purposes). This memory cell has a floating gate and a control gate disposed over and controlling the conductivity of a channel region of the substrate extending between source and drain regions. Various combinations of voltages are applied to the control gate, source and drain to program the memory cell (by injecting electrons onto the floating gate), to erase the memory cell (by removing electrons from the floating gate), and to read the memory cell (by measuring or detecting the conductivity of the channel region under the floating gate to determine the programming state of the floating gate).

The configuration and number of gates in non-volatile memory cells can vary. For example, U.S. Pat. No. 7,315,056 (which is incorporated herein by reference for all purposes) discloses a memory cell that additionally includes a program/erase gate over the source region. U.S. Pat. No. 7,868,375 (which is incorporated herein by reference for all purposes) discloses a memory cell that additionally includes an erase gate over the source region and a coupling gate over the floating gate. See also U.S. Pat. Nos. 6,747,310, 7,868,375, 9,276,005 and 9,276,006 (which are also incorporated herein by reference for all purposes).

Because the problem of shrinking the lithography size thereby reducing the channel width affects all semiconductor devices, a Fin-FET type of structure has been proposed. In a Fin-FET type of structure, a fin shaped member of the semiconductor substrate material connects the source region to the drain region. The fin shaped member has a top surface and two opposing side surfaces. Current from the source to the drain regions can then flow along the top surface as well as the two side surfaces. Thus, the surface width of the channel region is increased, thereby increasing the current flow, without sacrificing more semiconductor real estate, by "folding" the channel region into two side surfaces, thereby reducing the "footprint" of the channel region. Non-volatile memory cells using such Fin-FETs have been disclosed. Some examples of prior art Fin-FET non-volatile memory structures include U.S. Pat. Nos. 7,423,310, 7,410,913, 8,461,640, and 9,634,018. However, these prior art Fin-FET structures have disclosed using the floating gate as a stack gate device, or using trapping material, or using SRO (silicon rich oxide) or using nanocrystal silicon to store charges, or other memory cell configurations that are either too simplistic for memory cells having more than 2 gates or too complex for the number of gates at issue.

A number of problems have been discovered by the inventors when scaling memory cells down in size. Ultra-thin polysilicon or amorphous silicon film deposition and doping techniques are complex and often suffer from insufficient and non-uniform doping combined with structural non-uniformities. Ballistic electron transport in ultra-thin polysilicon floating gates leads to programming issues (difficulties to capture the hot electrons in ultra-thin floating gates). Integration of the control gate on top of the floating gate results in thick poly stack posing serious process integration challenges for advanced CMOS technologies (CMP planarization steps and following advanced lithography steps used in high K metal gate process flows). Capacitive coupling between neighboring floating gates is drastically increased with horizontal scaling. This results in strong cross-talk effects and requires complex management by design (read current of the cell becomes dependent on the charge state of the neighbor cells). The scaling of the planar floating gate memory cells is limited by reduction of the read currents related to transistors width scaling. Lower read currents penalize the access times and require complex design techniques to meet high speed access time specifications. Planar floating gate architecture doesn't allow for efficient control of the sub-threshold leakage of the floating gate and select transistors at advanced technology nodes, resulting in high background leakage from the unselected cells sharing the same bit line with selected cell.

BRIEF SUMMARY OF THE INVENTION

The aforementioned issues are addressed by a non-volatile memory cell that includes a semiconductor substrate having an upper surface with an upwardly extending fin that includes first and second side surfaces that oppose each other, a first electrode in electrical contact with a first portion of the fin, a second electrode in electrical contact with a second portion of the fin, wherein the first and second portions of the fin are spaced apart from each other such that a channel region of the fin includes portions of the first and second side surfaces and extends between the first and second portions of the fin, a floating gate that extends along a first portion of the channel region, wherein the floating gate extends along and is insulated from the first side surface, and wherein no portion of the floating gate extends along the second side surface, a word line gate that extends along a second portion of the channel region, wherein the word line gate extends along and is insulated from the first and second side surfaces, a control gate disposed over and insulated from the floating gate, and an erase gate having a first portion disposed laterally adjacent to and insulated from the floating gate and a second portion disposed vertically over and insulated from the floating gate.

A method of forming a non-volatile memory cell includes forming trenches into an upper surface of a semiconductor substrate so that the upper surface includes an upwardly extending fin that includes first and second side surfaces that oppose each other, forming a first electrode in electrical contact with a first portion of the fin, forming a second electrode in electrical contact with a second portion of the fin, wherein the first and second portions of the fin are spaced apart from each other such that a channel region of the fin includes portions of the first and second side surfaces and extends between the first and second portions of the fin, and forming a floating gate that extends along a first portion of the channel region, wherein the floating gate extends along and is insulated from the first side surface, wherein no portion of the floating gate extends along the second side surface, forming a word line gate that extends along a second portion of the channel region, wherein the word line gate extends along and is insulated from the first and second side surfaces, forming a control gate disposed over and insulated from the floating gate, and forming an erase gate having a first portion disposed laterally adjacent to and insulated from the floating gate and a second portion disposed vertically over and insulated from the floating gate.

Other objects and features of the present invention will become apparent by a review of the specification, claims and appended figures.

BRIEF DESCRIPTION OF THE DRAWINGS

FIGS. 1A-19A are side cross sectional views (along the row direction) showing the steps in forming the split-gate non-volatile memory cell of the present invention.

FIGS. 1B-19B are side cross sectional views showing the logic area of the substrate during the steps in forming the split-gate non-volatile memory cell of the present invention.

FIGS. 5C-19C are side cross sectional views (along the column direction) showing the steps in forming the split-gate non-volatile memory cell of the present invention.

FIGS. 15D-19D are side cross sectional views (along the column direction) showing the steps in forming the split-gate non-volatile memory cell of the present invention.

FIGS. 21A-25A are side cross sectional views (along the row direction) showing the steps in forming an alternate embodiment of the split-gate non-volatile memory cell of the present invention.

FIGS. 21B-25B are side cross sectional views showing the logic area of the substrate during the steps in forming the alternate embodiment of the split-gate non-volatile memory cell of the present invention.

FIGS. 21C-25C are side cross sectional views (along the column direction) showing the steps in forming the alternate embodiment of the split-gate non-volatile memory cell of the present invention.

DETAILED DESCRIPTION OF THE INVENTION

The following described embodiments effectively address scaling problems specific to conventional split gate memory. Specifically, the split gate memory cell of the present invention comprises two transistors compatible with mainstream FinFet CMOS fabrication flows. The two transistors are serially connected. Each transistor is formed on two adjacent silicon fins. First transistor (called word line or select transistor) has a FinFet architecture with a HKMG gate electrode wrapping around one of the silicon fins. The second transistor (called floating gate transistor) has a polysilicon floating gate inserted between the two silicon fins. The floating gate transistor is operated in fully depleted SOI-like mode where the ultra-thin channel is electrically controlled by the floating gate located on only one side of the silicon fin used as the channel. The floating gate transistor has a split gate architecture (separate control gate and erase gate) allowing for improved endurance and reliability. This architecture allows for efficient control of cell leakage (coming from both selected and unselected cells) while keeping reasonable floating gate physical dimensions and solving major memory cell scalability challenges (high K metal gate integration, read current scaling, floating gate cross-talk and isolation, and selected and unselected cells leakage control). There are two disclosed embodiments. The first one is implemented using a box-shaped floating gate. The second one is implemented using a U-shaped floating gate, allowing for improved control gate coupling to the floating gate for enhanced program efficiency.

Figure 1A:
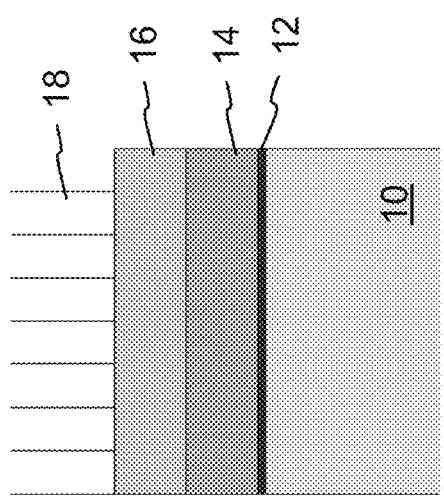
Figure 1B:
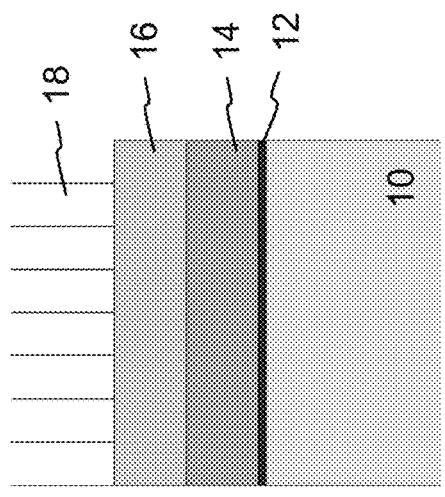

The formation of the first embodiment is shown in FIGS. 1A-19A, 5C-19C, 5D, and 15D-19D (which depict the formation of the memory cells in the memory area of the substrate) and FIGS. 1B-19B (which depict the formation of logic devices in a periphery region, also called the logic area, of the same substrate). The process begins by forming a silicon dioxide (oxide) layer 12 on both memory area and logic area portions of a silicon semiconductor substrate 10. A silicon nitride (nitride) layer 14 is formed on oxide layer 12. A hard mask material 16 is formed on the nitride layer 12. Photoresist 18 is formed on the hard mask material 16. The photoresist is then patterned, which includes a photolithography process that selectively exposes portions of the photoresist, and selectively removes portions of the photoresist to expose selective portions of the underlying material (i.e., strips of the hard mask material 16 in this case). The resulting structure is shown in FIGS. 1A and 1B.

Figure 2A:
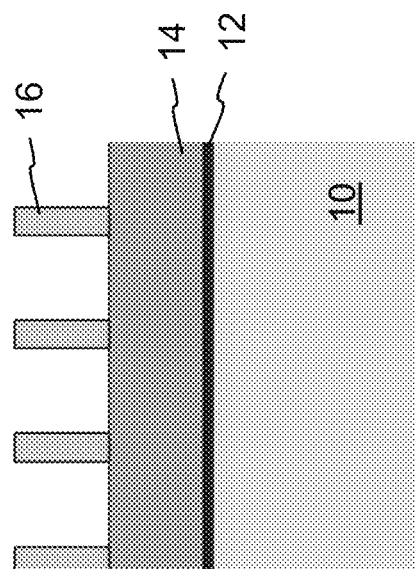
Figure 2B:
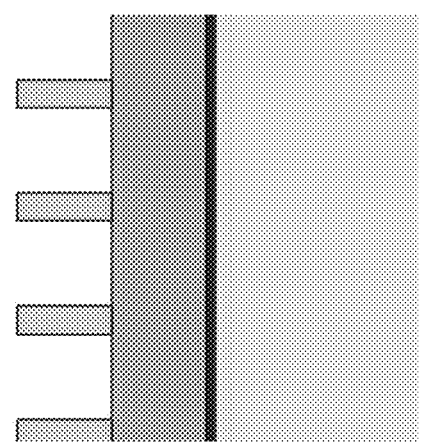
Figure 3A:
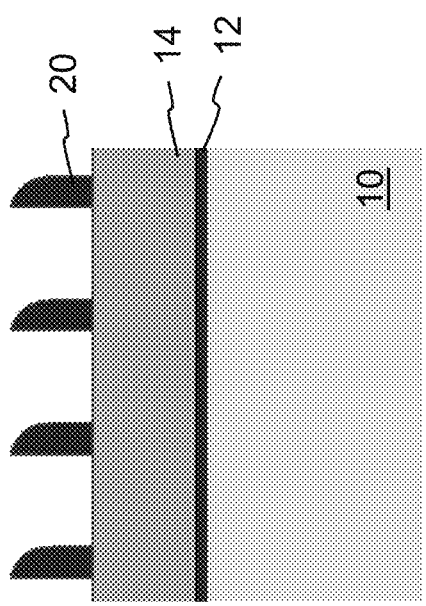
Figure 3B:
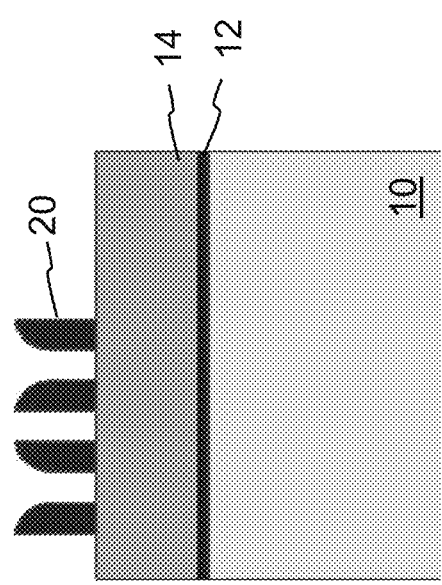

An etch is performed to remove the exposed portions of hard mask material 16, leaving vertical strips of hard mask material 16 as shown in FIGS. 2A and 2B (after photoresist removal). Oxide spacers 20 are formed along the sides of the hard mask material strips 16 by performing an oxide deposition followed by anisotropic oxide etch, which leaves spacers 20 on vertical sidewalls of hard mask strips 16. Photoresist is formed over the structure and patterned to leave strips of photoresist covering alternating spacers 20 in the memory area (e.g., the right hand spacer along each strip 16) and pairs of spacers 20 in the logic area. An oxide etch is then used to remove those oxide spacers 20 left exposed by photoresist. After photoresist removal, an etch is performed to remove hard mask strips 16, as shown in FIGS. 3A and 3B.

Figure 4A:
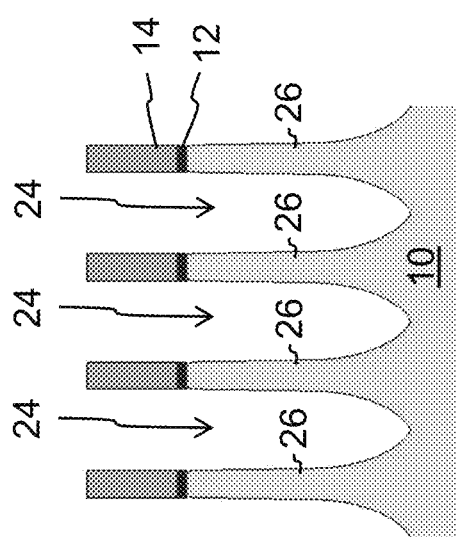
Figure 4B:
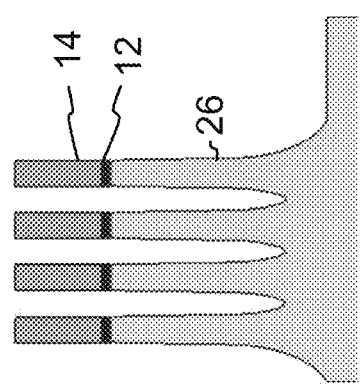
Figure 5A:
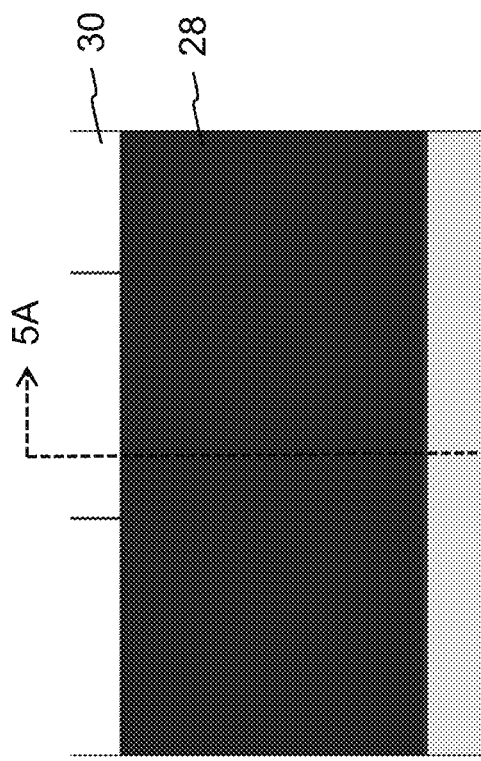
Figure 5B:
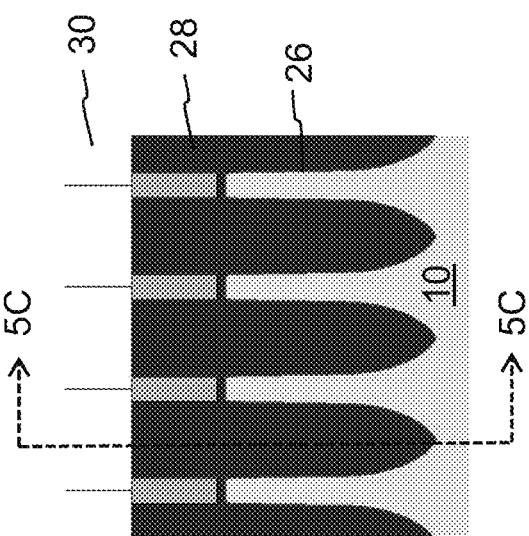
Figure 5C:
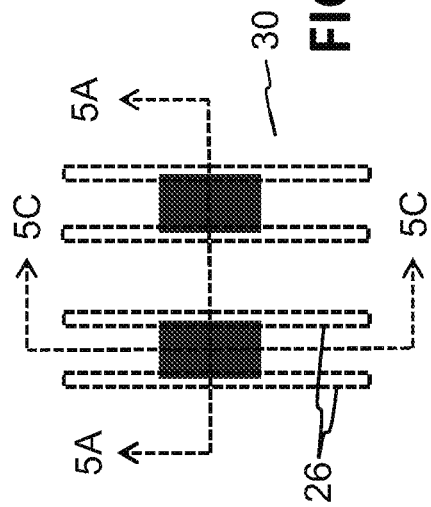
Figure 5D:
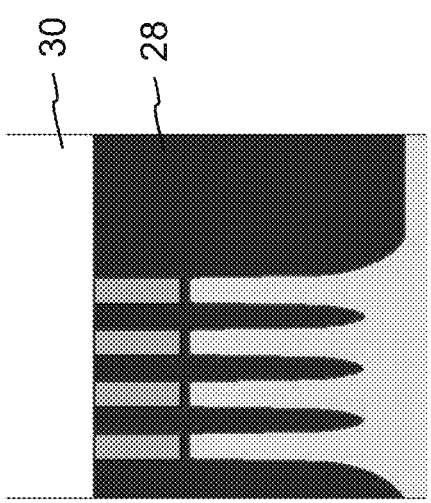
FIG. 5D is a top view illustrating the direction of the views of FIGS. 5A and 5C.

One or more etches are performed to remove those portions of nitride 14, oxide 12 and upper portions of substrate 10 that are not underneath oxide spacers 20, which results in the formation of trenches 24 that extend into the substrate, and thin fin structures 26 of the substrate 10 between adjacent trenches 24. Fins 26 extend in the vertical/column direction and are parallel to each other in both the memory and logic areas, as illustrated in FIGS. 4A and 4B. Insulation material 28 (e.g., oxide) is formed over the structure (including filling trenches 24 with oxide 28), followed by oxide planarization to remove any portion of oxide 28 above the tops of nitride 14. Photoresist 30 is formed over the structure and patterned to remove portions of the photoresist 30 over alternate filled trenches in the memory area as shown by FIGS. 5A and 5C-5D, and leave the entirety of the logic area covered as shown by FIG. 5B. An oxide etch is performed to remove those portions of the oxide 28 left exposed by photoresist 30, removing most of the oxide 28 from alternating trenches 24 in the memory area. After photoresist 30 is removed, a thick layer of polysilicon is then formed over the structure, filling the alternating trenches 24 in the memory area with polysilicon 32, as illustrated in the FIGS. 6A-6C. A poly etch is used to remove the top portion of poly 32, and recess the poly in the trenches 24 below the top of oxide 28. An oxide deposition and planarization (e.g., CMP) is performed to form oxide over the polysilicon, leaving polysilicon blocks 32 between alternating fins 26 in the memory area, as shown in FIGS. 7A-7C.

Figure 9C:
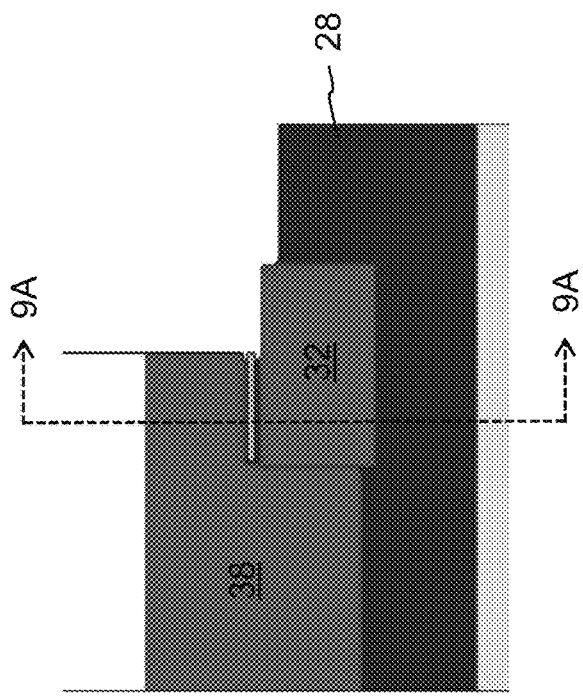
Figure 9A:
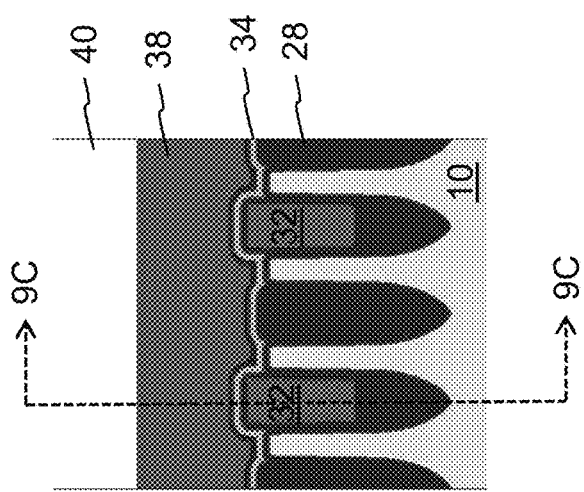
Figure 9B:
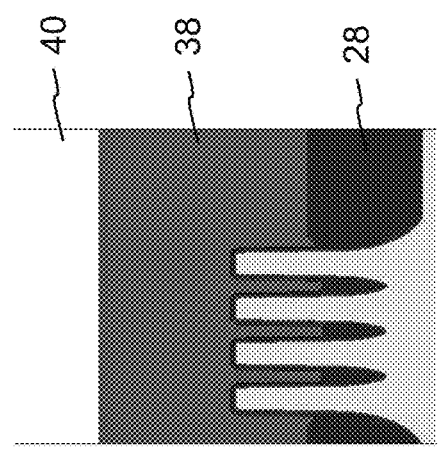

Nitride 14 is removed from the memory and logic areas by a nitride etch. An insulation layer (e.g., ONO, having oxide-nitride-oxide sublayers) 34 is formed over the structure. Photoresist 36 is formed over the structure and patterned to leave exposed the logic area and those portions of the memory area laterally adjacent to poly blocks 32. An oxide etch is then used to remove the ONO layer 34 and some of the oxide 28 in each of the trenches 24 between the fins 26 in the logic area, and the ONO layer 34 and oxide 28 laterally adjacent to one side of the poly blocks 32, as illustrated in FIGS. 8A-8C. A polysilicon layer 38 is deposited over the structure. Photoresist 40 is formed over the structure and patterned to leave a portion of the memory area exposed partially over poly block 32. An etch is used to remove the exposed portions of ONO layer 34, as shown in FIGS. 9A-9C.

Figure 10C:
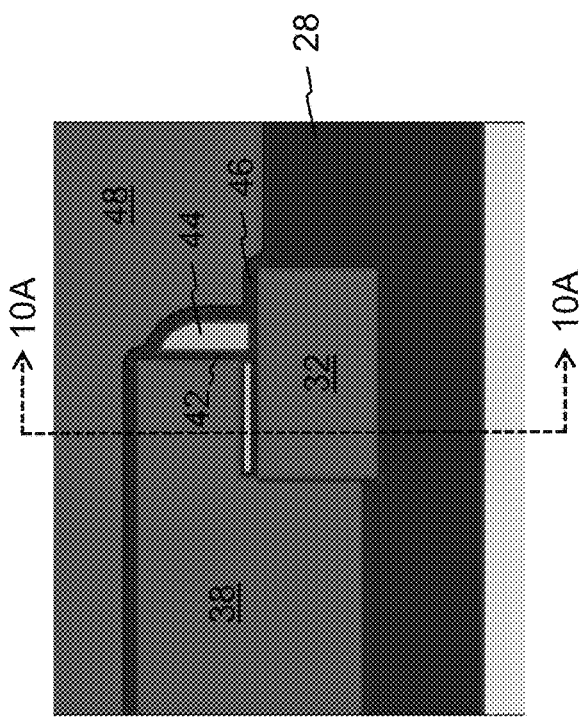
Figure 10A:
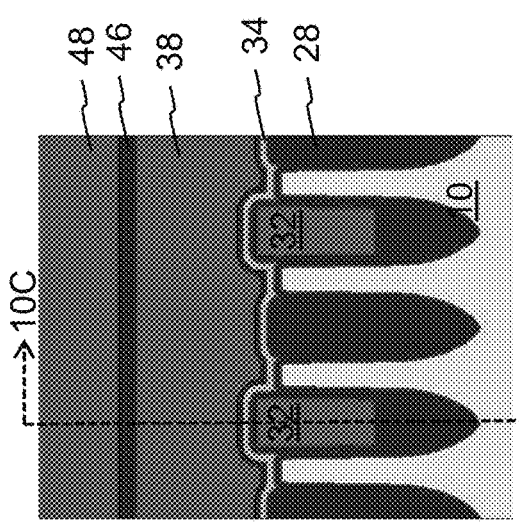
Figure 10B:
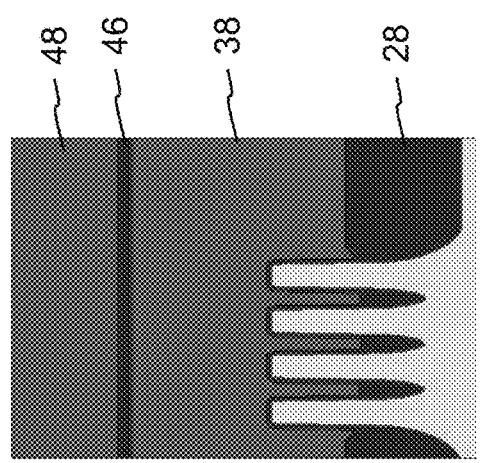
Figure 11C:
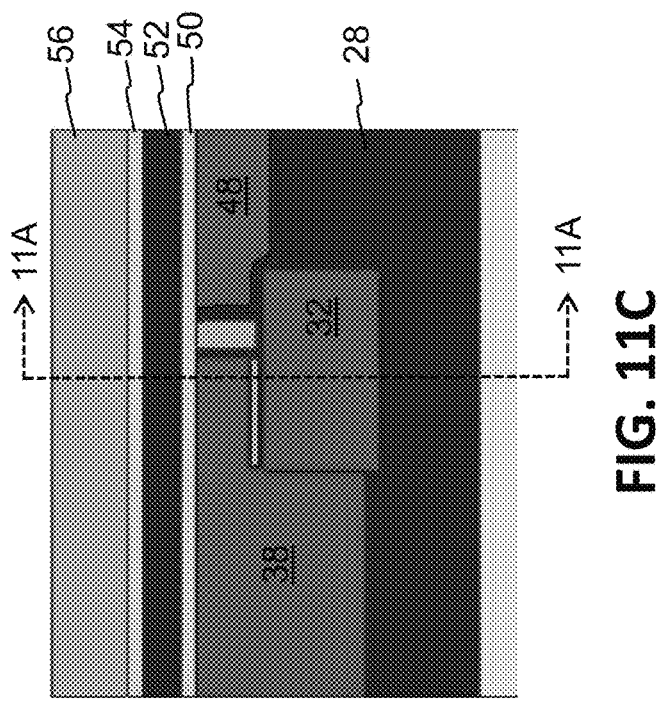
Figure 11A:
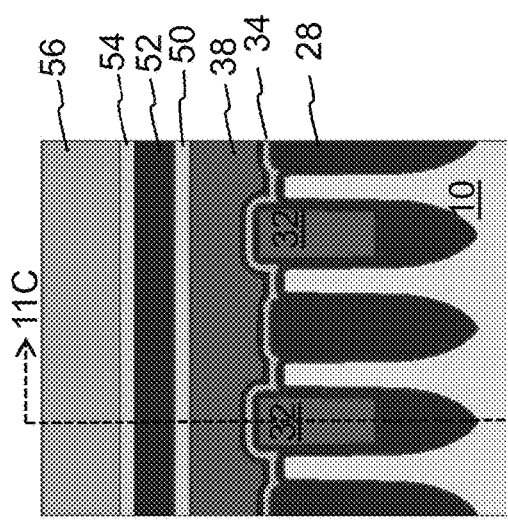
Figure 11B:
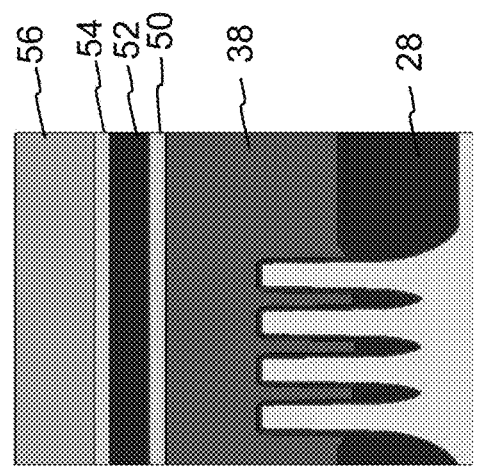

After photoresist removal, an oxide layer 42 is formed over the structure. A nitride deposition and etch is used to form nitride spacer 44 along the vertical portion of oxide layer 42 at the side wall of poly layer 38. An oxide etch is used remove exposed portions of oxide layer 42. An oxide deposition is then used to form oxide layer 46 over the structure, including over the exposed portion of poly block 32. Oxide 46 will serve as the tunnel oxide for erase operations. A poly layer 48 is then formed over the structure, as shown in FIGS. 10A-10C. A poly etch back, and oxide etch, and planarization are performed, to remove the upper portion of poly layer 48 and oxide 46, and planarize the upper surface. A series of depositions are performed to form silicon carbon nitride (SiCN) layer 50, oxide layer 52, SiCN layer 54 and hard mask layer 56 on the structure, as shown in FIGS. 11A-11C.

Figure 12C:
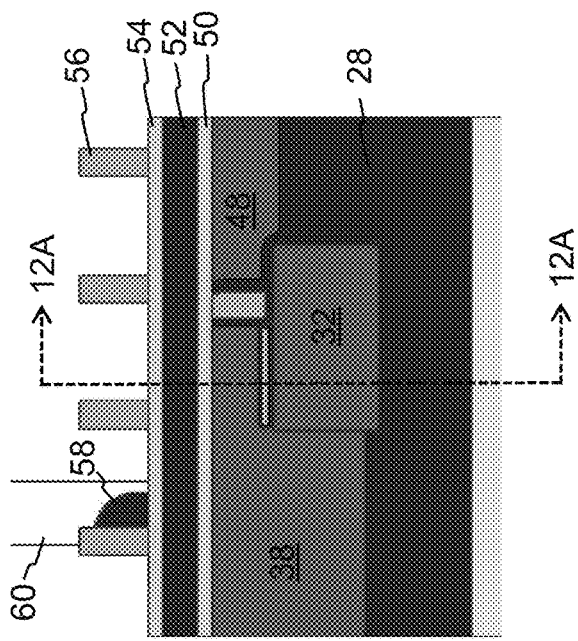
Figure 12A:
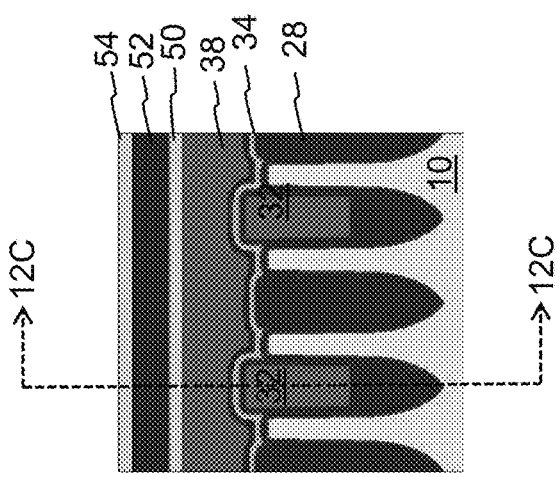
Figure 12B:
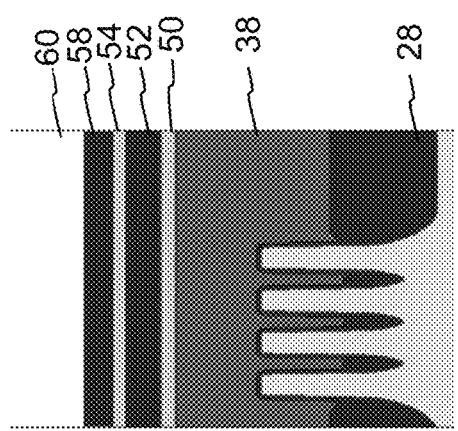
Figure 13C:
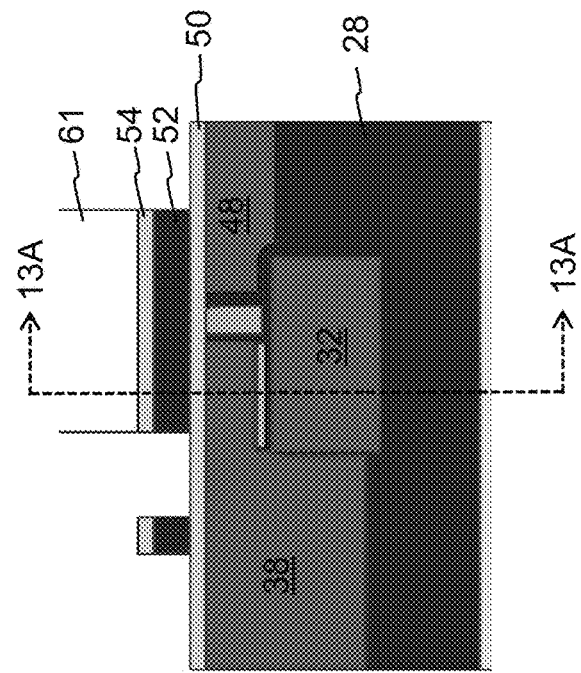
Figure 13A:
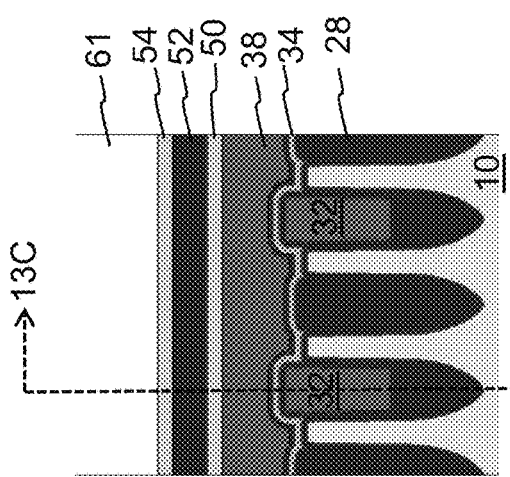
Figure 13B:
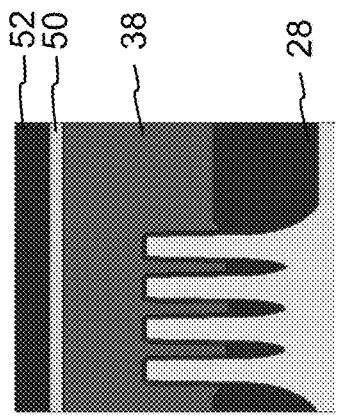
Figure 16A:
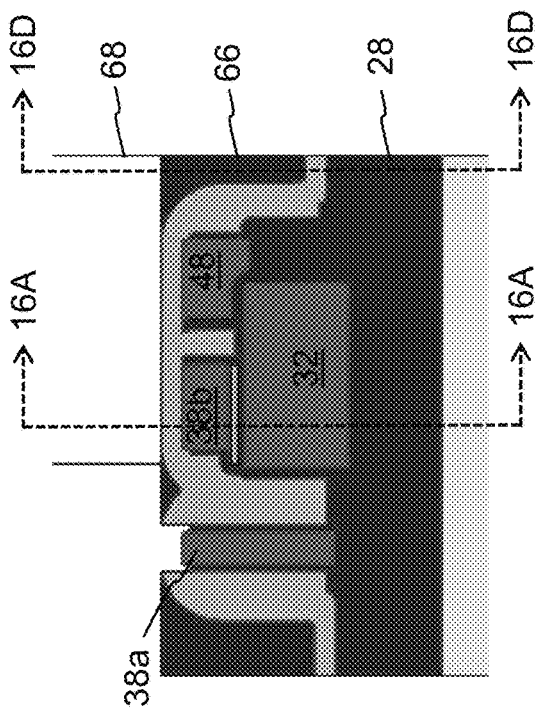
Figure 16B:
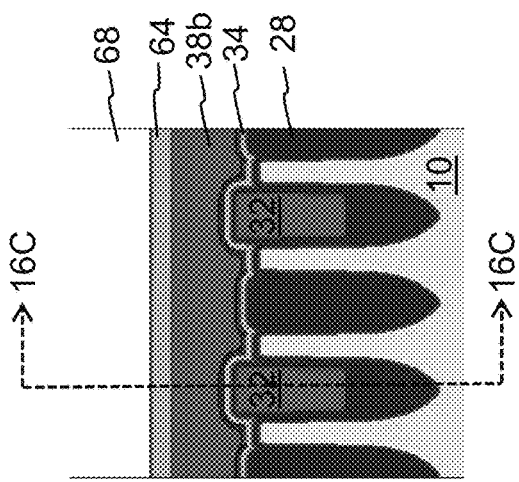
Figure 16C:
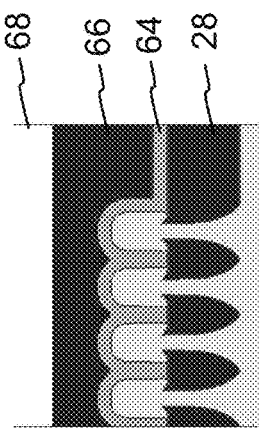
Figure 16D:
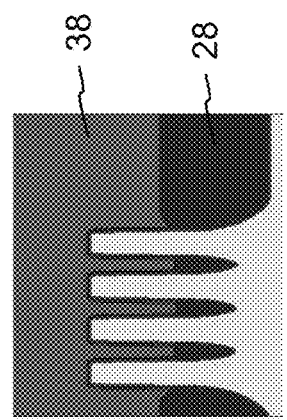
Figure 18C:
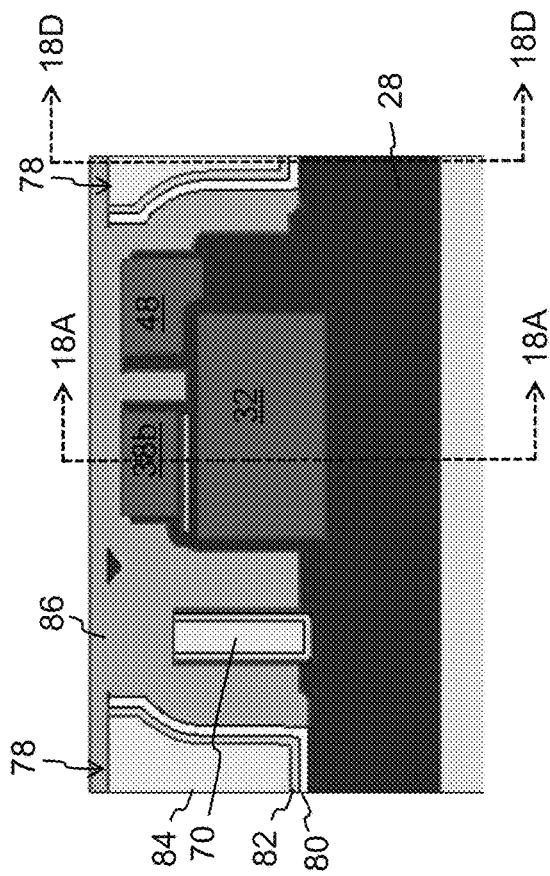
Figure 18D:
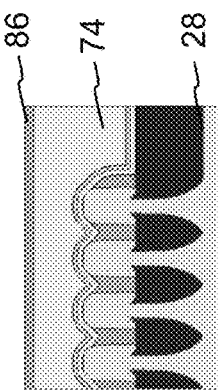
Figure 18A:
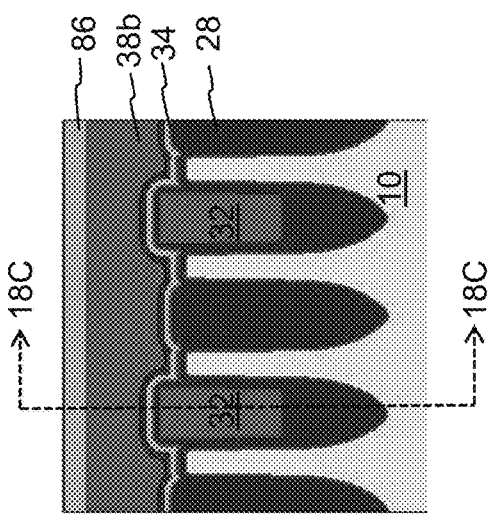
Figure 18B:
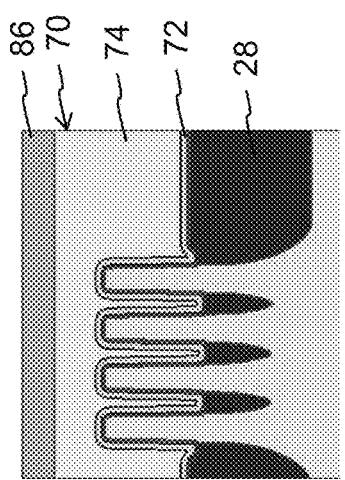

Photoresist is formed on the structure and patterned leaving only strips of photoresist in the memory area. An etch is performed to remove the exposed portions of the hard mask 56, leaving strips of hard mask 56 extending in row/horizontal direction. After photoresist removal, oxide deposition and etch are performed to form oxide spacers 58 against the strips of remaining hard mask material. Photoresist 60 is formed over the structure and patterned to cover only one of the spacers (for each memory cell) which is positioned over poly block 38. An oxide etch is used to remove all the spacers 58 except the one for each memory cell under the photo resist 60, as shown in FIGS. 12A-12C. After photoresist removal, photoresist 61 is formed on the structure and patterned to remain only over a portion of poly block 32 and over a portion of poly block 48 in the memory area. A SiCN etch is performed to remove exposed portions of SiCN layer 54. An oxide etch is performed to remove exposed portions of oxide layer 52 and oxide spacer 58. In the logic area, oxide layer 58 and SiCN layer 54 are removed. The resulting structure is shown in FIGS. 13A-13C.

After photoresist removal, a SiCN etch is performed to remove exposed portions of SiCN layer 50 and SiCN layer 54 in the memory area. A poly etch is then used to remove exposed portions of poly blocks 38 and 48 in the memory area, leaving poly blocks 38a and 38b of the original poly 38, and reducing the lateral size of poly block 48, as shown in FIGS. 14A-14C. Photoresist is formed over the structure, and patterned to remove it from a portion of the memory area adjacent to poly block 48. An oxide etch is performed to recess the exposed portions of oxide 28 (on one side of poly block 48). After photoresist removal, the exposed silicon fins at the edges of the memory cells in the memory cell region can optionally be subject to epitaxial growth to enlarge top portions 26a of the silicon fins. Oxide layer 52 and SiCN layer 50 are removed from the memory area (using photoresist over the logic area). A conformal layer of oxide 62 is formed over the structure. A nitride layer 64 is then formed over the structure, as shown in FIGS. 15A-15D. Oxide 66 (e.g., ILD oxide) is formed over the structure, and subject to CMP planarization using nitride 64 as the polish stop. Photoresist 68 is formed over the structure and patterned to leave exposed the area over poly block 38a and the logic area. A nitride etch is used to remove the portion of nitride layer 64 over the top of poly block 38a in the memory area, and nitride layer 64 in the logic area, as shown in FIGS. 16A-16D.

After photoresist removal, a poly etch and oxide etch are used to remove poly block 38a in the memory area and the surrounding oxide, and poly layer 38 in the logic area. A high K metal gate layer HKMG 70 is then formed over the structure, filling the void left by the removed poly block 38a. The HKMG layer 70 comprises an insulation layer 72 of a high K material (i.e. having a dielectric constant K greater than that of oxide, such as HfO2, ZrO2, TiO2, Ta2O5, or other adequate materials, etc.) underneath a conductive metal layer 74. This formation can be done using an atomic layer chemical vapor deposition, and an etch back. The high K metal gate layer will also be formed in the logic area (i.e., the process flow for forming HKMG is the same for both the memory area and the logic area). The resulting structure is shown in FIGS. 17A-17D.

Nitride is formed over the structure, followed by CMP planarization, covering the top of HKMG 70. ILD oxide 66 is removed from the memory area by patterning photoresist and oxide etch. Metal contacts 78 is formed on the structure (one to the side of HKMG 70, and one to the side of poly block 48), followed by CMP using nitride 76 as an etch stop. Metal contacts 78 can include Ti 80, TiN 82 and W 84 sublayers, which are annealed before a W CMP step. Nitride 86 is formed over the structure. The resulting structure is illustrated in FIGS. 18A-18D. Oxide 88 is formed over the structure. Patterned photoresist is used to form metal contacts 90 extending through oxide 88 and nitride 86 to make contact with various components. The final structure is shown in FIGS. 19A-19D.

Figure 20A:
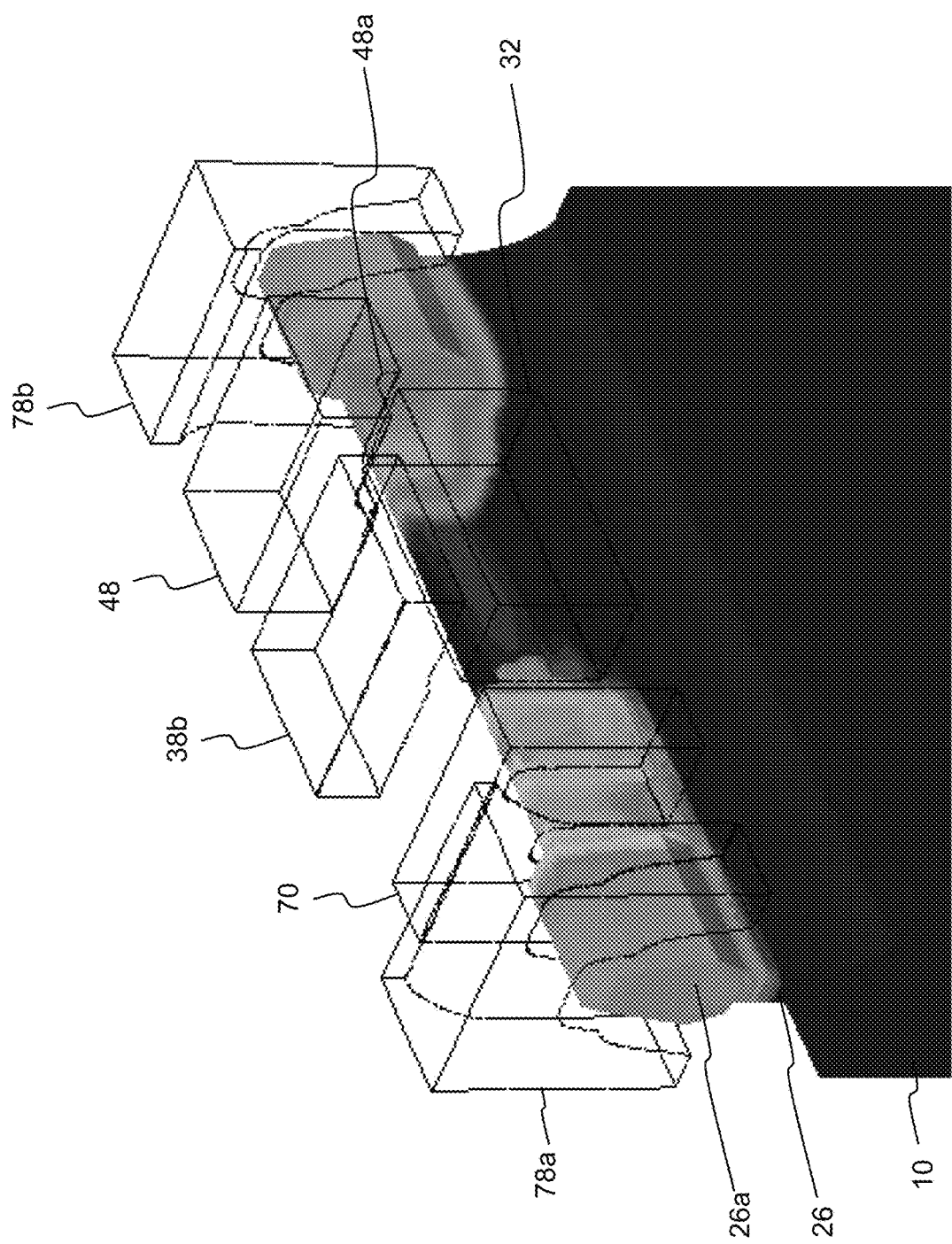
FIGS. 20A and 20B are partial perspective views of the split-gate non-volatile memory cell of the present invention.
Figure 20B:
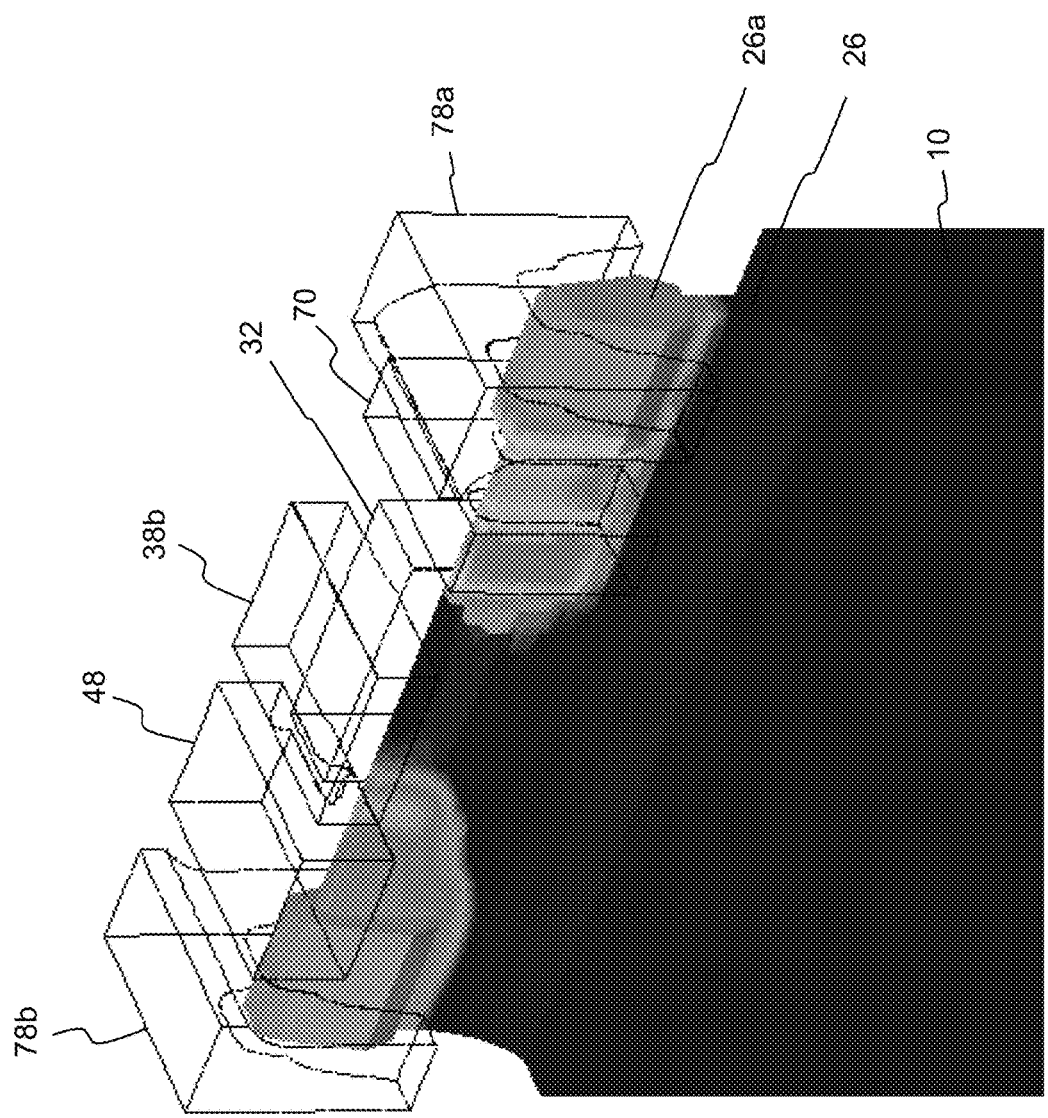
Figure 21C:
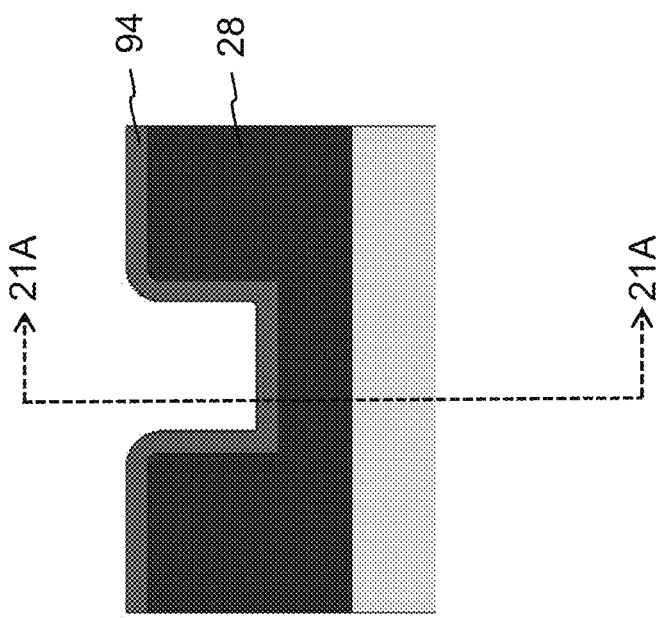
Figure 21A:
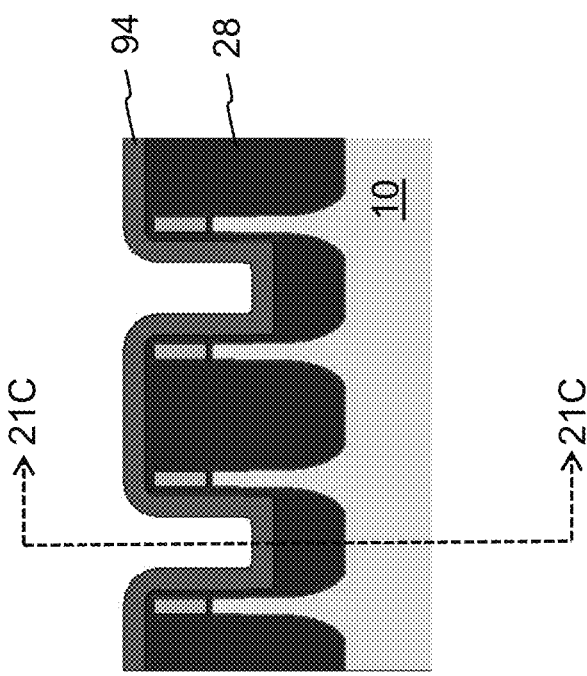
Figure 21B:
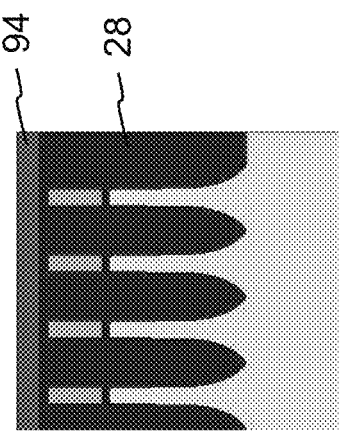
Figure 23C:
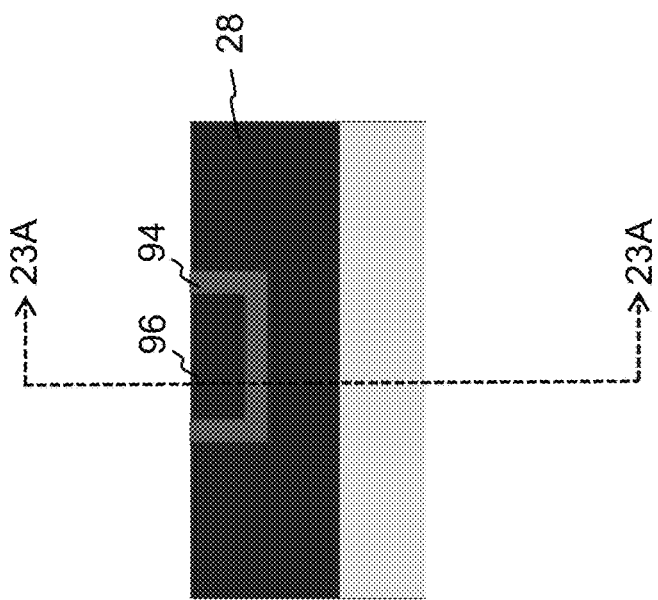
Figure 23A:
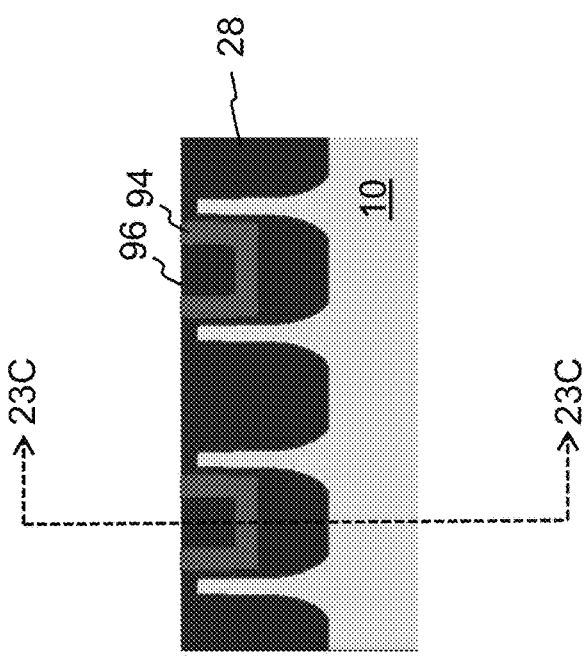
Figure 23B:
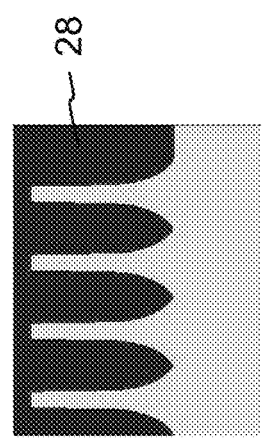
Figure 25C:
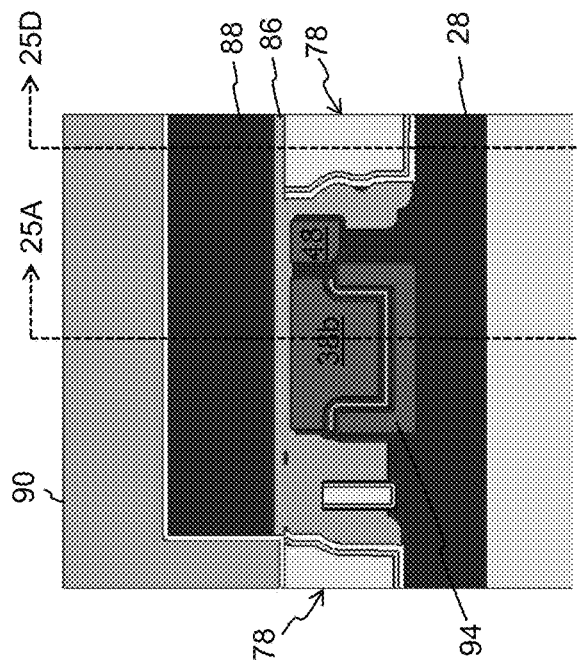
Figure 25D:
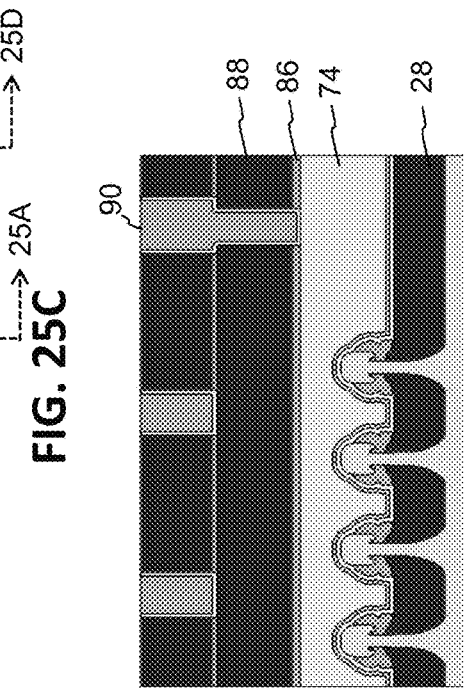
FIG. 25D is a side cross sectional view (along the column direction) showing the final steps in forming the alternate embodiment of the split-gate non-volatile memory cell of the present invention.
Figure 25A:
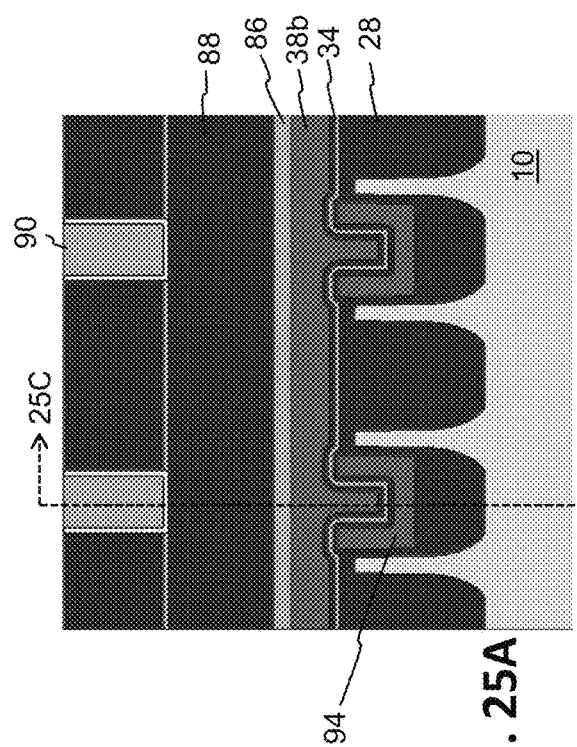
Figure 25B:
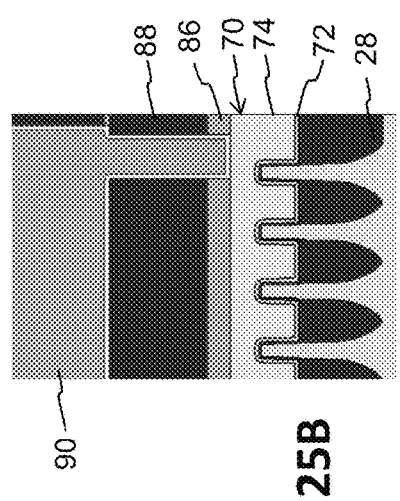

FIGS. 20A and 20B show perspective views of the final structure of a single memory cell having a floating gate transistor and word line transistor formed along one of the substrate fins 26. The memory cell includes spaced apart a bit line contact 78a and source line contact 78b, which are electrodes in electrical contact with the enlarged top portions 26a of the fin 26. Each electrode 78a and 78b is disposed on both opposing sides and on the top of fin 26. Between the electrodes 78a and 78b are a word line gate 70, a floating gate 32, a control gate 38b and an erase gate 48. The word line gate 70 extends along and is insulated from both opposing sides and the top of fin 26. The floating gate 32 is disposed only on one side of the fin 26. The control gate is disposed over the fin 26, and over the floating gate 32. The erase gate 48 is disposed over the fin 26 and partially over the floating gate 32, and includes a notch 48a that faces an upper corner of the floating gate 32 for enhanced erase efficiency. The fin 26 includes a channel region that extends from the electrode 78a (which is the drain or bit line contact) to the electrode 78b (which is the source contact). The conductivity of one portion of the channel region surrounded by the word line gate is controlled by the word line gate, and the conductivity of another portion of the channel region adjacent the floating gate is controlled by the floating gate.

It should be appreciated that while the figures herein show a single memory cell, multiple memory cells are formed end to end along fin 26 forming a column of memory cells, and other columns of memory cells are formed along other fins that extend parallel to fin 26 shown. Each memory cell is formed over or adjacent to two fins formed in the silicon substrate and having non-uniform doping profiles in both vertical and horizontal directions. The isolation trenches between fins are filled with silicon oxide. This finfet architecture allows for the increase of the effective read current density per cell area due to channel width extension in vertical direction. The floating gate is preferably n+ type polysilicon (or amorphous silicon) disposed between and adjacent to a portion of the fins and isolated from them by oxide. The floating gate extends in the vertical direction above the top of the fins. The floating gate has box-like shape, with a rectangular vertical cross section shape (i.e., a cross section looking from the side, see FIGS. 19A and 19C). The floating gate and adjacent portions of the fins form the first transistor of the cell, called the floating gate transistor. The floating gate transistor is operated like a fully depleted silicon-on-insulator transistor. This configuration allows efficient reduction of the floating gate parasitic coupling with neighboring cells while keeping reasonable floating gate dimensions. A portion of the floating gate is disposed below the tops of the fins which can limit the height of the gate stack, facilitating integration with HKMG CMOS process flow.

The control gate is preferably n+ type polysilicon (or amorphous silicon), covers a part of the floating gate, and is isolated from the floating gate and from the top of the fins by a dielectric (silicon oxide-nitride-oxide stack or similar). The erase gate is preferably n+ type polysilicon (or amorphous silicon) and covers the remaining part of the floating gate and is isolated from the floating gate by the tunnel oxide. On one side, the erase gate is isolated from control gate by silicon oxide or by silicon oxide/nitride/oxide spacer. On the other side, the erase gate extends over floating gate, forming a wrap-around corner shape (i.e., notch 48a) used for erase operation by the highly efficient corner-enhanced Fowler-Nordheim tunneling mechanism. The word line gate is preferably metal (including tungsten and/or work function adjustment metal) covering a second portion of the finfet channel region on both side surfaces of the fin. The metal word line gate and underlying fin portions form a word line transistor. Finfet architecture of the word line transistor allows for the improvement of the control of the sub-threshold leakage current from unselected cells sharing the same column and improves high temperature read performance and related memory partitioning.

The source electrode 78b consists of a W/TiN/TiSi2 stack (or similar) on top of enlarged epitaxial shapes 26a grown over finfets and is adjacent to the floating gate transistor. The source electrode 78b of the cells shares source electrodes of other cells in the same row, forming a common source line extending in the row direction. The bit line electrode 78a consists of a W/TiN/TiSi2 stack (or similar) on top of the enlarged epitaxial shapes 26a grown over finfets and is adjacent to word line transistor. The bit line electrode 78a is connected to bit line electrodes of the neighboring cells sharing the same column, and are connected together to form common bit line 92 extending in the column direction. The word line and floating gate transistors are surrounded by silicon nitride spacers isolating them from source and bit line electrode areas. The fins 26 are preferably n+ type doped in those areas adjacent the bit line electrode, the source line electrode, underneath the silicon nitride spacers, and underneath the erase gate in the area not adjacent to the floating gate. The fins 26 are p-type doped in the areas adjacent to floating gate and in the area underneath the word line gate. Vertical P-type doping profile is highly non-uniform, with relatively low doping in top portions of the fins and very high doping at the bottoms of the fins. The top of the highly doped profile should be above the bottom of the floating gate in order to avoid formation of the parasitic leakage path in bottom portion of the finfet channel. The desired doping profiles can be achieved through one or more implantations performed at different stages of the fabrication process flow described above. The implantations can be shared with the logic area, or be implemented just on the memory area.

This memory cell architecture allows for achieving reasonable physical dimensions of the floating gate, simplifies processing, and solves issues related to ballistic transport and ultra-thin poly deposition processing. Moreover, embedding at least some of the floating gate between fins solves related isolation and cross talk issues while optimizing gate stack topology for high K metal gate integration and providing a way for further cell size scaling.

The formation of a second embodiment is shown in FIGS. 21A-25A, 21B-25B, 21C-25C and 25D. The process begins with the same structure of FIGS. 5A-5C. An oxide etch is performed to remove those portions of the oxide 28 left exposed by photoresist 30, removing most of the oxide 28 from alternating trenches 24 in the memory area. After photoresist 30 is removed, instead of forming a thick layer of polysilicon 32 that fills the alternating tranches as disclosed above with respect to FIGS. 6A-6C, a thin conformal layer of in-situ n-type doped polysilicon 94 is formed over the structure, lining the walls of alternating trenches 24 in the memory area with polysilicon 94, as illustrated in the FIGS. 21A-21C. An oxide deposition followed by CMP planarization is used to fill the remainder of the trenches 24 with oxide 96 and to planarize the structure, leaving poly layer 94 with a U-shaped cross sectional shape. A poly etch is then used to recess the tops of the U-shaped poly layer 94, as shown in FIGS. 22A-22C. Oxide is formed over the structure, and a CMP is used to lower and planarize the upper surface of the structure (using nitride 14 as a CMP stop). A nitride etch is used to remove the nitride 14. An oxide layer is formed over the structure, which is followed by a CMP or etch back using the poly 94 as the stop, as shown in FIGS. 23A-23C.

Figure 27A:
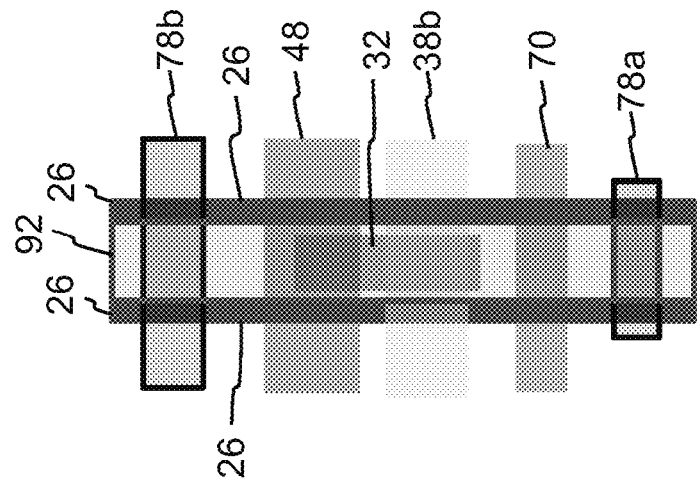
FIG. 27A is a top view showing the memory cell components of the first embodiment.
Figure 26A:
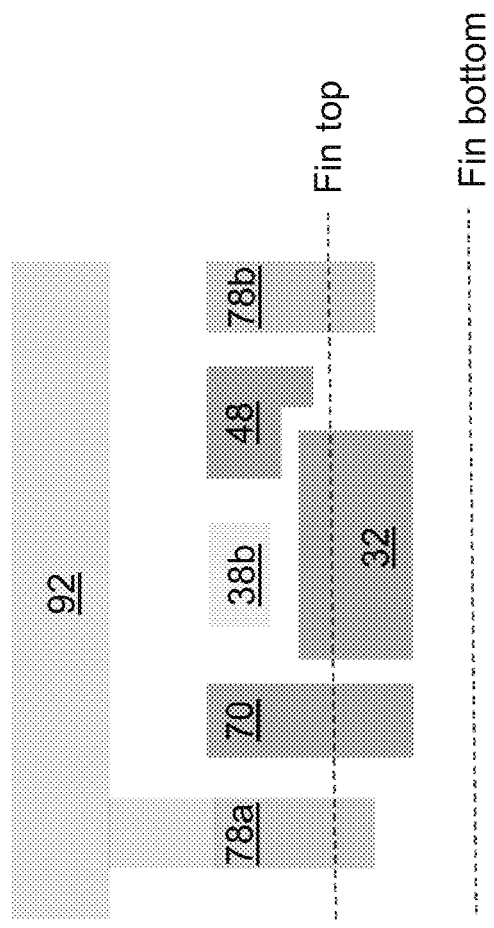
FIG. 26A is a side cross sectional view (along the column direction) showing the memory cell components of the first embodiment.
Figure 27B:
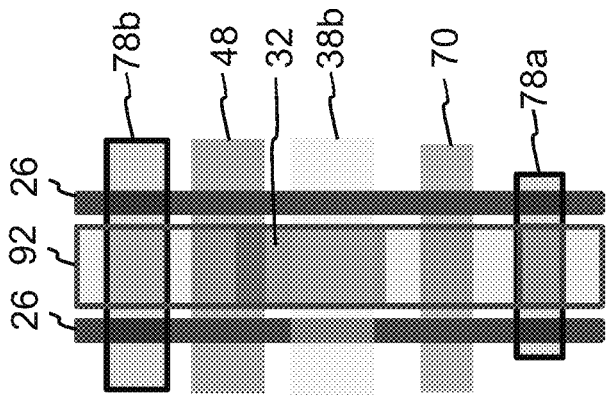
FIG. 27B is a top view showing the memory cell components of the second embodiment.
Figure 26B:
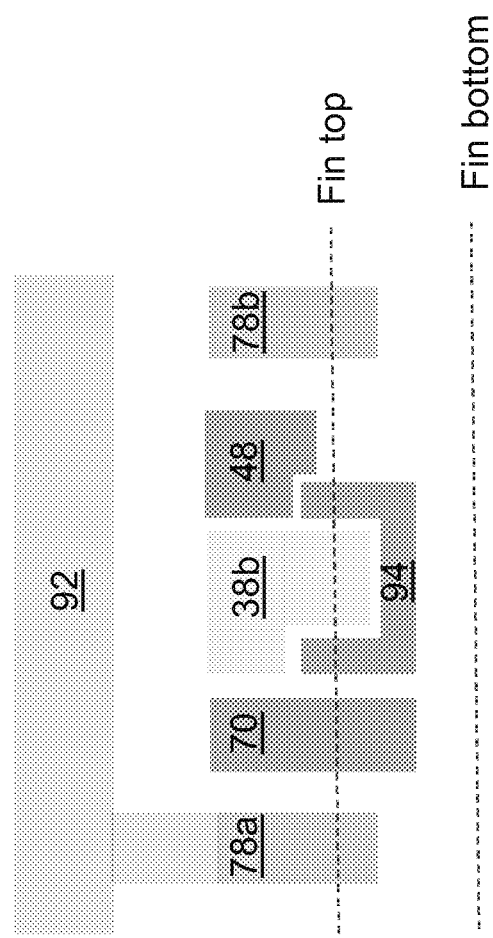
FIG. 26B is a side cross sectional view (along the column direction) showing the memory cell components of the second embodiment.

Photoresist is formed over the structure and patterned to leave exposed the oxide 96 inside the U-shaped poly 94. An oxide etch is then used to remove oxide 96 inside of the U-shaped poly 94. After photoresist removal, the ONO insulation layer 34 then is formed over the structure as discussed above, as illustrated in FIGS. 24A-24C. Processing continues using the processing steps set forth above with respect to FIGS. 8A-8C to FIGS. 19A-19C, and FIGS. 15D-19D, resulting in the final structure shown in FIGS. 25A-25D. The final memory cell in this second embodiment has essentially the same structure as that in the first embodiment, except that the floating gate has a U-shaped cross sectional shape instead of a box shape, and the control gate 38b has a lower portion that extends down into the interior of the U-shape of the floating gate 94 for enhancing capacitive coupling between the floating gate 94 and the control gate 38b. FIGS. 26A and 26B show the differences in cross sectional shape of the first and second embodiments, respectively. FIGS. 27A and 27B are top views of the first and second embodiments, respectively.

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. For example, the floating gate could be formed of amorphous silicon instead of polysilicon. Further, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

The invention claimed is:

1. A non-volatile memory cell comprising:
   a semiconductor substrate having an upper surface with an upwardly extending fin that includes first and second side surfaces that oppose each other and an upwardly extending second fin that includes third and fourth side surfaces that oppose each other;
   a first electrode in electrical contact with a first portion of the fin;
   a second electrode in electrical contact with a second portion of the fin, wherein the first and second portions of the fin are spaced apart from each other such that a channel region of the fin includes portions of the first and second side surfaces and extends between the first and second portions of the fin;
   a floating gate that extends along a first portion of the channel region, wherein the floating gate extends along and is insulated from the first side surface, wherein no portion of the floating gate extends along the second side surface, wherein at least a portion of the floating gate is disposed between the fin and the second fin and extends along and is insulated from the third side surface, and wherein no portion of the floating gate extends along the fourth side surface;
   a word line gate that extends along a second portion of the channel region, wherein the word line gate extends along and is insulated from the first and second side surfaces;
   a control gate disposed over and insulated from the floating gate;
   an erase gate having a first portion disposed laterally adjacent to and insulated from the floating gate and a second portion disposed vertically over and insulated from the floating gate.

2. The non-volatile memory cell of claim 1, wherein no conductive gate is disposed along and insulated from a portion of the second side surface that is opposite to a portion of the first side surface along which the floating gate extends.

3. The non-volatile memory cell of claim 1, wherein the word line gate includes a metal material, and wherein the word line gate is insulated from the first and second side surfaces by a high K insulation material.

4. The non-volatile memory cell of claim 1, wherein the control gate and the erase gate each are disposed vertically over the fin.

5. The non-volatile memory cell of claim 1, wherein the first and second portions of the fin each have a width that is greater than a width of the channel region of the fin.

6. The non-volatile memory cell of claim 1, wherein the first and second portions of the fin each have a height that is greater than a height of the channel region of the fin.

7. The non-volatile memory cell of claim 1, wherein the first electrode extends along the first and second side surfaces of the first portion of the fin, and wherein the second electrode extends along the first and second side surfaces of the second portion of the fin.

8. The non-volatile memory cell of claim 1, wherein the floating gate has a rectangular vertical cross section.

9. The non-volatile memory cell of claim 1, wherein the floating gate has a U-shape vertical cross section.

10. The non-volatile memory cell of claim 3, wherein the floating gate, the control gate and the erase gate each include polysilicon material.

11. The non-volatile memory cell of claim 10, wherein the first and second electrodes each include a metal material.

12. The non-volatile memory cell of claim 9, wherein the control gate includes a lower portion that extends into the U-shape vertical cross section of the floating gate.

13. A method of forming a non-volatile memory cell comprising:
   forming trenches into an upper surface of a semiconductor substrate so that the upper surface includes an upwardly extending fin that includes first and second side surfaces that oppose each other and an upwardly extending second fin that includes third and fourth side surfaces that oppose each other;
   forming a first electrode in electrical contact with a first portion of the fin;
   forming a second electrode in electrical contact with a second portion of the fin, wherein the first and second portions of the fin are spaced apart from each other such that a channel region of the fin includes portions of the first and second side surfaces and extends between the first and second portions of the fin;
   forming a floating gate that extends along a first portion of the channel region, wherein the floating gate extends along and is insulated from the first side surface, wherein no portion of the floating gate extends along the second side surface, wherein at least a portion of the floating gate is disposed between the fin and the second fin and extends along and is insulated from the third side surface, and wherein no portion of the floating gate extends along the fourth side surface;

forming a word line gate that extends along a second portion of the channel region, wherein the word line gate extends along and is insulated from the first and second side surfaces;

forming a control gate disposed over and insulated from the floating gate;

forming an erase gate having a first portion disposed laterally adjacent to and insulated from the floating gate and a second portion disposed vertically over and insulated from the floating gate.

14. The method of claim 13, wherein no conductive gate is disposed along and insulated from a portion of the second side surface that is opposite to a portion of the first side surface along which the floating gate extends.

15. The method of claim 13, wherein the word line gate includes a metal material, and wherein the word line gate is insulated from the first and second side surfaces by a high K insulation material.

16. The method of claim 13, wherein the floating gate, the control gate and the erase gate each include polysilicon material.

17. The method of claim 13, wherein the control gate and the erase gate are each disposed vertically over the fin.

18. The method of claim 13, wherein the first and second portions of the fin each have a width and a height that is greater than a width and a height respectively of the channel region of the fin.

19. The method of claim 13, wherein the first electrode extends along the first and second side surfaces of the first portion of the fin, and wherein the second electrode extends along the first and second side surfaces of the second portion of the fin.

20. The method of claim 13, wherein the floating gate has a rectangular vertical cross section.

21. The method of claim 13, wherein the floating gate has a U-shape vertical cross section.

22. The method of claim 16, wherein the first and second electrodes each include a metal material.

23. The method of claim 21, wherein the control gate includes a lower portion that extends into the U-shape vertical cross section of the floating gate.

* * * * *